United States Patent
Lee et al.

(10) Patent No.: US 10,217,513 B2
(45) Date of Patent: Feb. 26, 2019

(54) PHASE CHANGE MEMORY DEVICES INCLUDING TWO-DIMENSIONAL MATERIAL AND METHODS OF OPERATING THE SAME

(71) Applicant: Samsung Electronics Co., Ltd., Suwon-si, Gyeonggi-do (KR)

(72) Inventors: Minhyun Lee, Yongin-si (KR); Seunggeol Nam, Suwon-si (KR); Changhyun Kim, Seoul (KR); Hyeonjin Shin, Suwon-si (KR); Yeonchoo Cho, Seongnam-si (KR); Jinseong Heo, Seoul (KR); Seongjun Park, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 15/448,998

(22) Filed: Mar. 3, 2017

(65) Prior Publication Data

US 2018/0061490 A1 Mar. 1, 2018

(30) Foreign Application Priority Data

Aug. 23, 2016 (KR) .................. 10-2016-0106977

(51) Int. Cl.
G11C 11/00 (2006.01)
G11C 13/00 (2006.01)
(Continued)

(52) U.S. Cl.
CPC ...... *G11C 13/0004* (2013.01); *G11C 13/0069* (2013.01); *G11C 13/0097* (2013.01);
(Continued)

(58) Field of Classification Search
CPC ............ G11C 13/0004; G11C 13/0069; G11C 13/0097; H01L 27/24
(Continued)

(56) References Cited

U.S. PATENT DOCUMENTS 5,613,578 A 3/1997 Moseley et al.
5,783,818 A 7/1998 Manabe et al.
(Continued)

FOREIGN PATENT DOCUMENTS

JP 3509314 B2 3/2004
JP 3607837 B2 1/2005
(Continued)

OTHER PUBLICATIONS

Karel-Alexander, et al, "Structural phase transitions in two-dimensional Mo- and W-dicalcogenide monolayers", Nature Communications 5, Jul. 1, 2014, pp. 1-9.
(Continued)

*Primary Examiner* — Huan Hoang
(74) *Attorney, Agent, or Firm* — Harness, Dickey & Pierce, P.L.C.

(57) ABSTRACT

A phase change memory device may include a phase change layer that includes a two-dimensional (2D) material. The phase change layer may include a layered structure that includes one or more layers of 2D material. The phase change layer may be provided between a first electrode and a second electrode, and the phase of at least a portion of one or more of the layers of 2D material may be changed based on an electrical signal applied to the phase change layer through the first electrode and the second electrode. The 2D material may include a chalcogenide-based material or phosphorene. The 2D material may be associated with a phase change temperature that is greater than or equal to about 200° C. and lower than or equal to about 500° C.

41 Claims, 25 Drawing Sheets

(51) Int. Cl.
H01L 27/24 (2006.01)
H01L 45/00 (2006.01)

(52) U.S. Cl.
CPC ............. H01L 27/24 (2013.01); H01L 45/06 (2013.01); H01L 45/1233 (2013.01); H01L 45/1253 (2013.01); H01L 45/141 (2013.01); H01L 45/142 (2013.01); H01L 45/143 (2013.01); H01L 45/144 (2013.01); H01L 45/1641 (2013.01)

(58) Field of Classification Search
USPC ........................................................ 365/163
See application file for complete search history.

(56) References Cited

U.S. PATENT DOCUMENTS

| | | | |
|---|---|---|---|
| 7,052,757 | B2 | 5/2006 | Chaiken et al. |
| 7,667,219 | B2 | 2/2010 | Chang et al. |
| 7,876,605 | B2 | 1/2011 | Bolivar et al. |
| 9,401,435 | B2 * | 7/2016 | Lee ................. H01L 29/792 |
| 9,673,390 | B2 | 6/2017 | Reed et al. |
| 2004/0086802 | A1 * | 5/2004 | Gibson ................. B82Y 10/00 430/270.13 |
| 2009/0050869 | A1 | 2/2009 | Kim et al. |
| 2009/0127535 | A1 * | 5/2009 | Chen ................. H01L 27/2463 257/2 |
| 2009/0231910 | A1 | 9/2009 | Liu et al. |
| 2012/0099371 | A1 * | 4/2012 | Kim .................... G11C 11/5678 365/163 |
| 2014/0160839 | A1 * | 6/2014 | Kim .................... G11C 13/0004 365/163 |
| 2015/0122315 | A1 * | 5/2015 | Shin ........................ H01L 29/73 136/255 |
| 2015/0340089 | A1 | 11/2015 | Stojcevska et al. |
| 2016/0019954 | A1 | 1/2016 | Vaskivskyi et al. |
| 2016/0247859 | A1 * | 8/2016 | Takaki ................ H01L 27/2481 |

FOREIGN PATENT DOCUMENTS

| | | |
|---|---|---|
| JP | 2005116156 A | 4/2005 |
| JP | 3845781 B2 | 11/2006 |
| JP | 4953697 B2 | 6/2012 |
| JP | 4971796 B2 | 7/2012 |
| KR | 20-0258435 | 12/2001 |
| KR | 101395192 B1 | 5/2014 |
| WO | WO-2015/167351 A1 | 11/2015 |

OTHER PUBLICATIONS

Ho-Ki Lyeo et al, "Thermal conductivity of phase-change material $Ge_2Sb_2Te_5$", Applied Physics Letters 89.15, Oct. 10, 2006: 151904.
C. Muratore, et al., "Cross-plane thermal properties of transition metal dichalcogenides", Applied Physics Letter 102.8, Feb. 26, 2013: 081604.
A. Conan, et al., "Mechanism of Thermal Switching in Bulk $MoTe_{2-x}$ Compounds", Physica Status Solidi (a) 38.2 (1976): 505-512.
Dong Hoon Keum et al., "Bandgap opening in few-layered monoclinic $MoTe_2$", Nature Physics Letters DOI: 10.1038, May 4, 2015: 482-486.
Yao Li, et al., "Structural semiconductor-to-semimetal phase transition in two-dimensional materials induced by electrostatic gating", Nature Communication 7, Article No. 10671, Feb. 12, 2016.
Seunghyun Song et al., "Room-Temperature Semiconductor-metal Transition of MoTe2 Thin Film Engineered by Strain", Center for Integrated Nanostructure Physics, et al., Nano Letters 16.1 (2015): 188-193.
Noboru Yamada, et al., Rapid phase transitions of GeTeSb2Te3 pseudobinary amorphous thin films for an optical disk memory, Applied Physics Letter 69.5, Mar. 1; 1991: 2849-2856.
Alexander Kolobov, et al., "Understanding the phase-change mechanism of rewritable optical media", Nature Materials, 3.10, Oct. 2004: 703-708.
Yifan Sun, et al., "Low-temperature Solution Synthesis of Few-Layer 1T'-MoTe2 Nanostructures Exhibiting Lattice Compression", Angew. Chem. Int. Ed. 2016, 55.8: 2830-2834.
Yao Zhou, et al., "Structural Phase Stability Control of Monolayer $MoTe_2$ with Adsorbed Atoms and Molecules", J. Phys. Chem, C 119.37, Aug. 25, 2015: 21674-21680.
Guoping Gao, et al., "Charge Mediated Semiconducting-to-Metallic Phase Transition in Molybdenum Disulphide Monolayer and Hydrogen Evolution Reaction in New 1T' Phase", The Journal of Physical Chemistry C 119.23, May 21, 2015: 13124-13128.
Extended European Search Report dated Nov. 6, 2017 issued in corresponding European Application No. 17162095.8-1556.
European Office Action dated Dec. 4, 2018 issued in corresponding European Application No. 17162095.8.

* cited by examiner

< α phase >

< β phase >

PHASE CHANGE MEMORY DEVICES INCLUDING TWO-DIMENSIONAL MATERIAL AND METHODS OF OPERATING THE SAME

CROSS-REFERENCE TO RELATED APPLICATIONS

This application claims the benefit under 35 U.S.C. § 119 of Korean Patent Application No. 10-2016-0106977, filed on Aug. 23, 2016, in the Korean Intellectual Property Office, the disclosure of which is incorporated herein in its entirety by reference.

BACKGROUND

1. Field

The present disclosure relates to memory devices and methods of operating the same, and more particularly, to phase change memory devices and methods of operating the same.

2. Description of the Related Art

Phase change memory devices include nonvolatile memory devices, including flash memories, ferroelectric RAMs (FeRAMs), and magnetic RAMs (MRAMs). A phase change memory devices may include a phase change layer configured to be a data storage layer. When a particular (or, alternatively, predetermined) reset voltage is applied to the phase change layer, a partial region of the phase change layer may change phase to become an amorphous region, and when a particular (or, alternatively, predetermined) set voltage is applied to the phase change layer, the amorphous region may change phase into a crystalline region. Where the phase change layer includes an amorphous region, the resistance of the phase change layer may be a first resistance. Where the phase change layer includes a crystalline region, the resistance of the phase change layer may be a second resistance. The first resistance may be greater than the second resistance. In this manner, the phase change memory device may write and read bit data by using the resistance characteristics of the phase change layer whose resistance varies according to phase of one or more regions of the phase change layer.

In researching/developing phase change materials used in phase change memory devices, various aspects may be considered, including providing reduced power consumption, providing increased operation speed, providing increased data endurance, providing reduced thermal conductivity, and enabling ease of fabrication (high productivity). It is not easy to develop phase change materials configured to satisfy various requirements and memory devices using the same.

SUMMARY

Some example embodiments include phase change materials having excellent properties, and memory devices using the same.

Some example embodiments include phase change materials configured to satisfy various requirements such as high operation speed, high data endurance, low thermal conductivity, and low power consumption, and memory devices using the same.

Some example embodiments include phase change layers including a two-dimensional (2D) material having a layered structure, and memory devices using the same.

Some example embodiments include phase change materials capable of easily implementing multi-bit characteristics, and memory devices using the same. Provided are stacked phase change memory devices.

Some example embodiments include methods of operating the memory devices using the phase change materials (phase change layers).

Additional aspects will be set forth in part in the description which follows and, in part, will be apparent from the description, or may be learned by practice of the presented embodiments.

According to some example embodiments, a phase change memory device may include a first electrode, a second electrode, and a phase change layer between the first electrode and the second electrode. The phase change layer may include a layered structure of at least one layer of two-dimensional (2D) material, the at least one layer of 2D material configured to at least partially change phase based on an electrical signal applied to the phase change layer through the first electrode and the second electrode.

The 2D material may include a chalcogenide-based material. The chalcogenide-based material may include at least one of $MoTe_x$, $CoTe_x$, $NbS_x$, $SnS_x$, $In_xSe_y$, In—S, Tl—Se, Ge—Te, Ge—S, and Ge—Se. The chalcogenide-based material may have a chemical formula unit of $MG_x$, "M" being a metal element, "G" being a chalcogen element, and "x" satisfying about $1.5 \leq x < 2$. The 2D material may include a mixture of a first chalcogenide-based material and a second chalcogenide-based material. The first chalcogenide-based material may be $MoTe_x$, and the second chalcogenide-based material may be $WTe_x$.

The 2D material may include phosphorene.

The phase change layer may further include an intercalation material in the layered structure of the 2D material, and the intercalation material may include Li.

The phase change layer may further include a dopant included in the 2D material, and the dopant may include at least one of N, O, Si, and W.

The 2D material may be associated with a phase change temperature that is greater than or equal to about 200° C. and lower than or equal to about 500° C.

The phase change layer may have a thickness that is equal to or less than about 50 nm.

The at least one layer of 2D material may include a layer that extends substantially in parallel to a surface of a substrate.

The at least one layer of 2D material may include a layer that extends substantially in perpendicular to a surface of a substrate.

The first electrode may include a plug-type electrode portion, the plug-type electrode portion may have a width that is smaller than a width of the phase change layer, and the plug-type electrode portion may be in contact with the phase change layer.

The phase change layer may include a plug portion, the plug portion may have a width that is smaller than a width of the first electrode, and the plug portion may be in contact with the first electrode.

The phase change memory device may further include a unit cell, the unit cell including the first electrode, the phase change layer, and the second electrode; and a switching device electrically connected to the unit cell, the switching device including at least one of a transistor, a diode, a threshold switch, and a varistor.

The phase change layer may be configured to exhibit one or more multi-bit memory characteristics.

The layered structure of at least one layer of two-dimensional (2D) material may include a multi-layer structure, the multi-layer structure including an alternating stack of a first material layer including the 2D material and a second material layer including a different material. The multi-layer structure may be configured to exhibit the one or more multi-bit memory characteristics of the phase change layer.

The phase change memory device may be a stacked memory device, the stacked memory device including a plurality of memory devices stacked on a substrate.

According to some example embodiments, a method of operating a phase change memory device may include: applying a first electrical signal to a phase change layer for a first period of elapsed time, the phase change layer including a layered structure of at least one layer of two-dimensional (2D) material, to change a phase of at least a portion of the at least one layer of 2D material from a first crystalline phase to a second crystalline phase and to reduce a resistance of the phase change layer to cause the phase change layer to become a set state; and applying a second electrical signal to the phase change layer for a second period of elapsed time to change the phase of at least a portion of the at least one layer of 2D material from the second crystalline phase to the first crystalline phase and to increase the resistance of the phase change layer to cause the phase change layer to become a reset state, the second period of elapsed time being longer than the first period of elapsed time.

The phase change layer may be associated with a first phase change temperature and a second phase change temperature. The first phase change temperature may be a particular critical temperature associated with a phase change from the first crystalline phase into the second crystalline phase, such that the phase change layer is configured to change phase from the first crystalline phase to the second crystalline phase based on being at the first phase change temperature. The second phase change temperature may be a separate critical temperature associated with a phase change from the second crystalline phase into the first crystalline phase, such that the phase change layer is configured to change phase from the second crystalline phase to the first crystalline phase based on being at the second phase change temperature. The first phase change temperature may be greater than the second phase change temperature. The applying of the first electrical signal may include cooling the 2D material after heating the 2D material to a first temperature that is greater than the first phase change temperature. The applying of the second electrical signal may include annealing the 2D material at a second temperature that is lower than the first phase change temperature and greater than the second phase change temperature.

The first temperature may be lower than a melting temperature of the 2D material.

The first temperature may be greater than a melting temperature of the 2D material, and the second temperature may be lower than the melting temperature of the 2D material.

The applying of the second electrical signal may include performing an initial heating operation and subsequently performing an annealing operation. Performing the initial heating operation may include heating the 2D material to at least a melting temperature of the 2D material. Performing the annealing operation may include annealing the 2D material at the second temperature.

The first phase change temperature may be greater than or equal to about 200° C. and lower than or equal to about 500° C.

The second phase change temperature may be greater than or equal to about 100° C. and lower than or equal to about 300° C.

The 2D material may include a chalcogenide-based material.

The 2D material may include phosphorene.

According to some example embodiments, a phase change layer may include a layered structure of a two-dimensional (2D) material. The layered structure may include at least one layer of the 2D material. The at least one layer of the 2D material may be configured to at least partially change phase based on an electrical signal applied to the phase change layer.

The layered structure may be configured to be included in a phase change memory device, such that the layered structure is between a first electrode and a second electrode, and the at least one layer of 2D material is configured to at least partially change phase based on an electrical signal applied to the at least one layer of the 2D material through the first electrode and the second electrode.

The 2D material may include a chalcogenide-based material.

The chalcogenide-based material may include at least one of $MoTe_x$, $CoTe_x$, $NbS_x$, $SnS_x$, $In_xSe_y$, In—S, Tl—Se, Ge—Te, Ge—S, and Ge—Se.

The chalcogenide-based material may have a chemical formula unit of $MG_x$, "M" being a metal element, "G" being a chalcogen element, and "x" being about 1.5.

The 2D material may include a mixture of a first chalcogenide-based material and a second chalcogenide-based material.

The first chalcogenide-based material may be $MoTe_x$, and the second chalcogenide-based material may be $WTe_x$.

The 2D material may include phosphorene.

The phase change layer may further include an intercalation material in the layered structure of the 2D material. The intercalation material may include Li.

The phase change layer may further include a dopant, the dopant included in the 2D material. The dopant may include at least one of N, O, Si, and W.

The 2D material may be associated with a phase change temperature that is greater than or equal to about 200° C. and lower than or equal to about 500° C.

BRIEF DESCRIPTION OF THE DRAWINGS

These and/or other aspects will become apparent and more readily appreciated from the following description of the embodiments, taken in conjunction with the accompanying drawings in which.

Figure 5A:
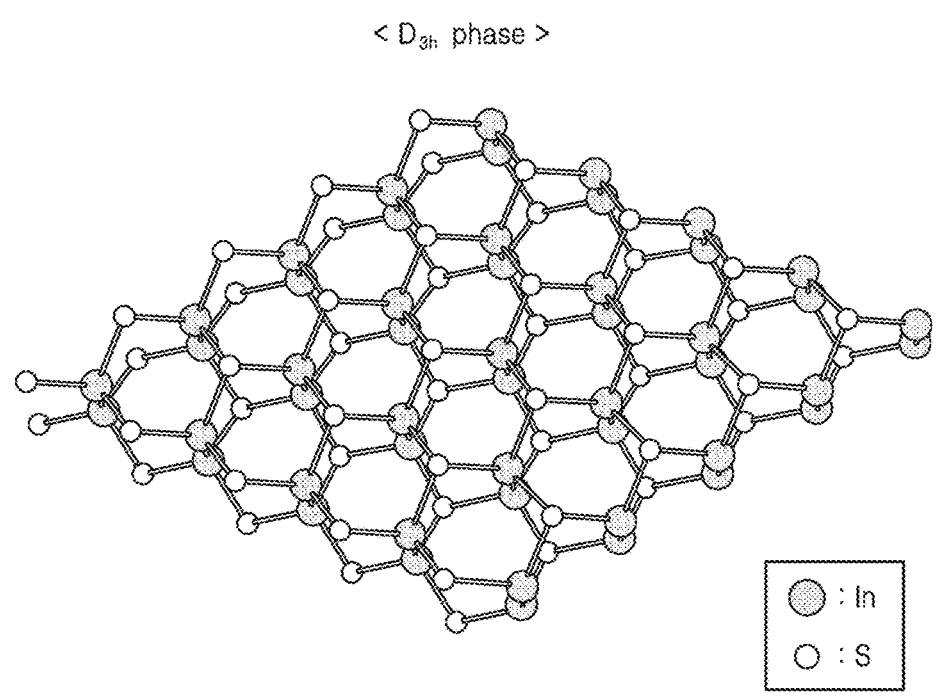
Figure 5B:
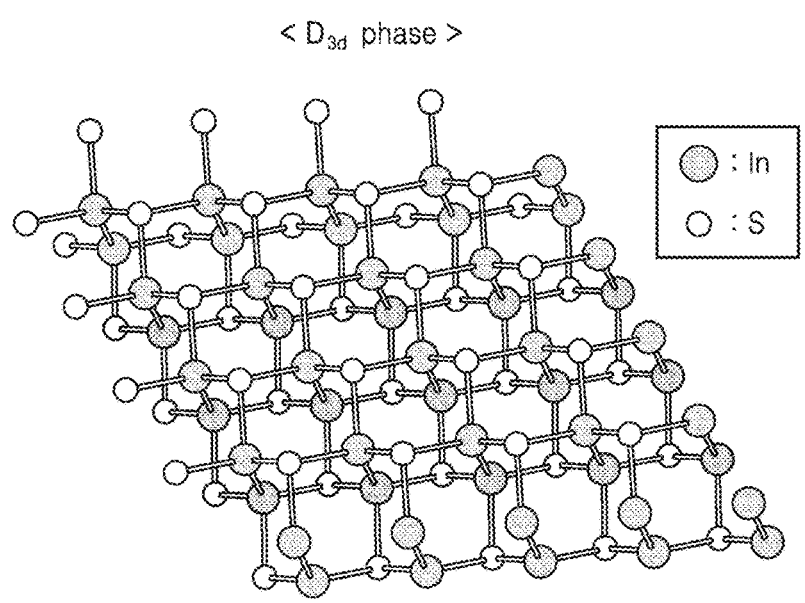
Figure 6A:
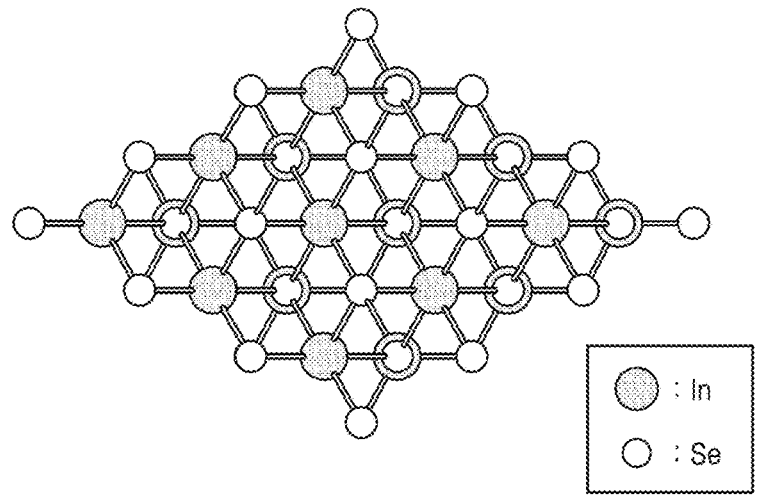
Figure 6B:
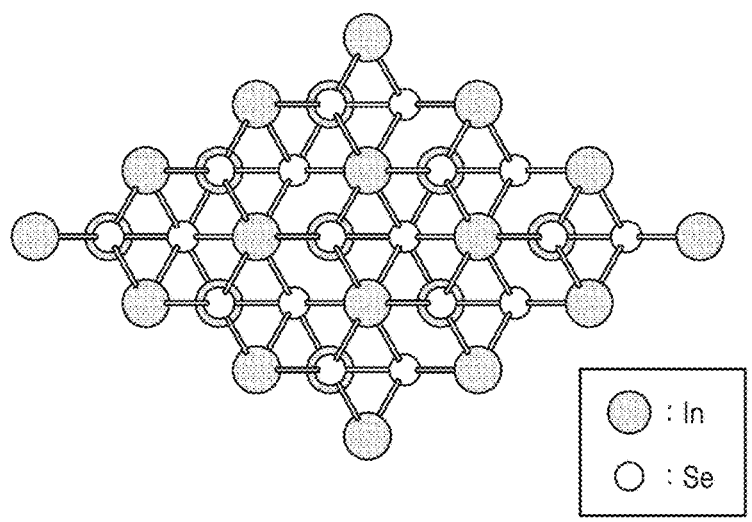
Figure 7:
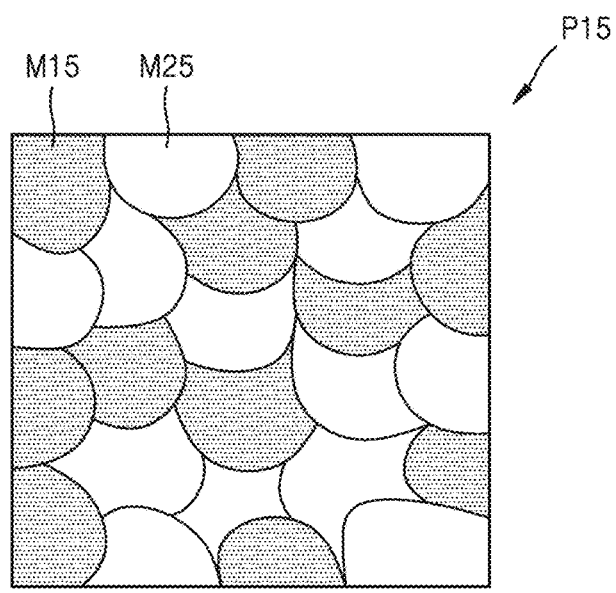
Figure 8A:
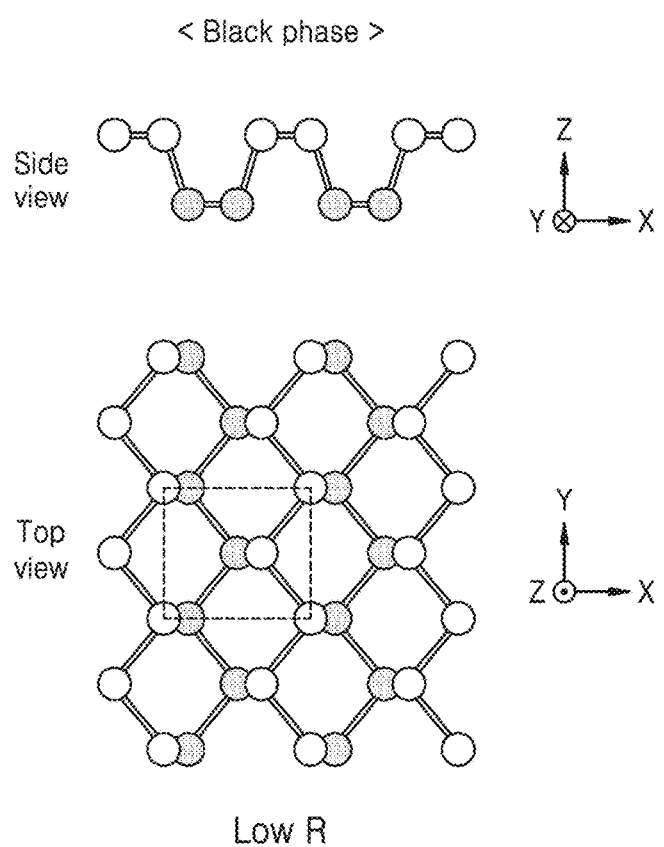
Figure 8B:
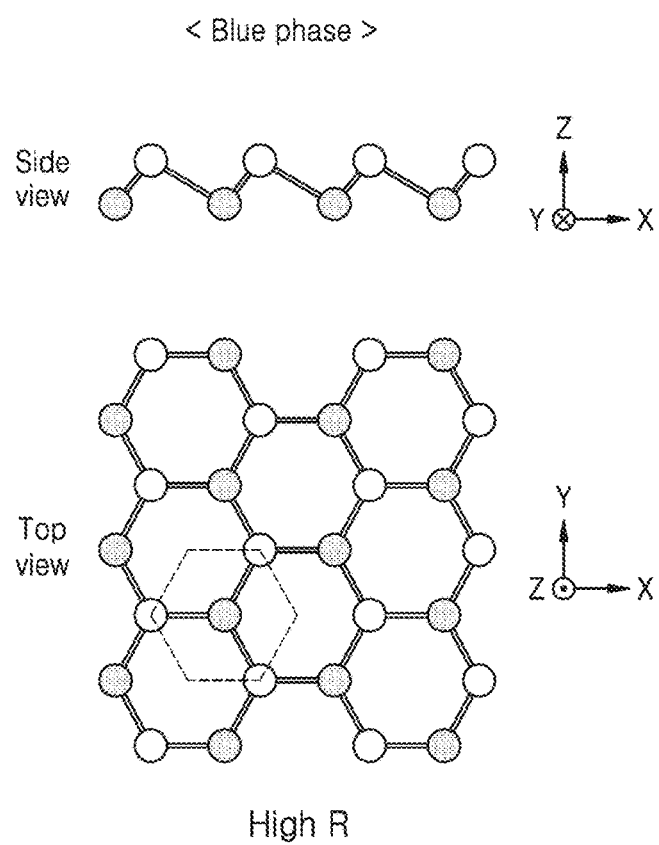
Figure 10:
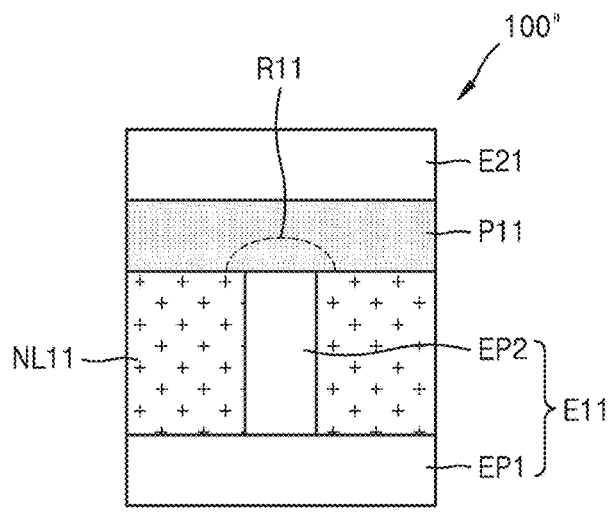
Figure 11:
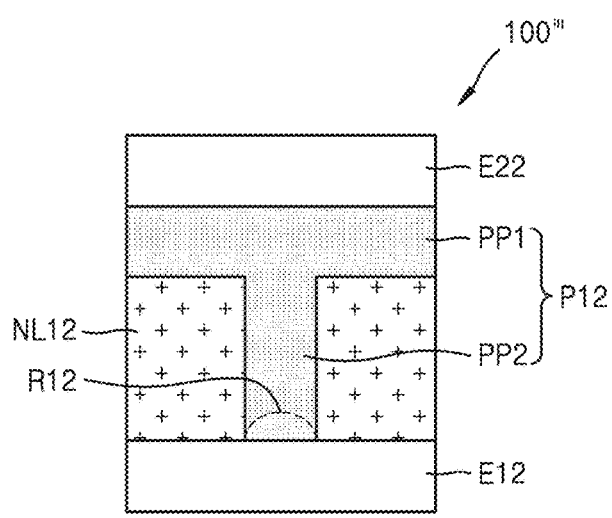
Figure 12:
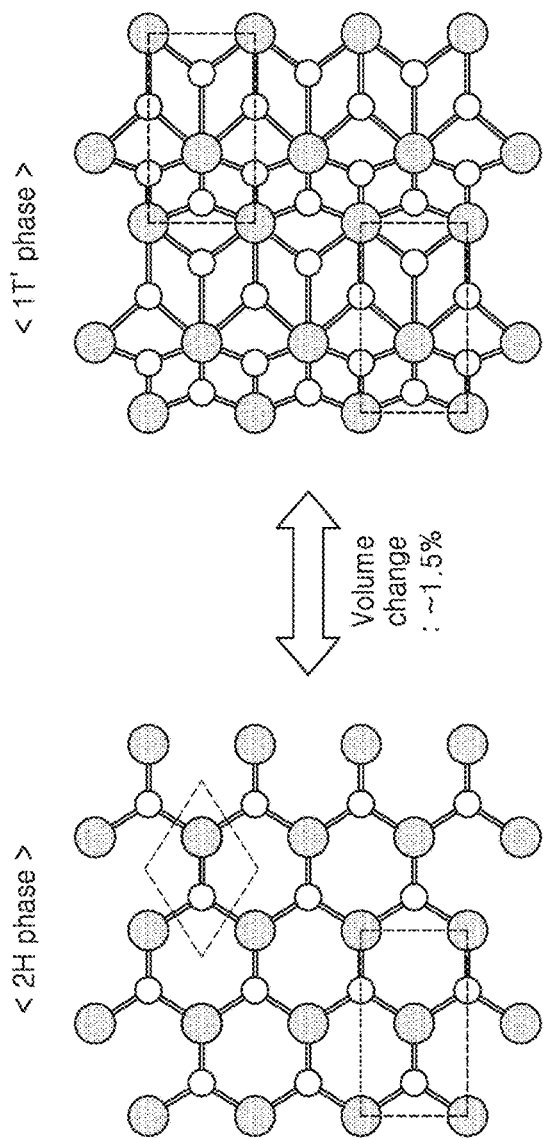
Figure 13:
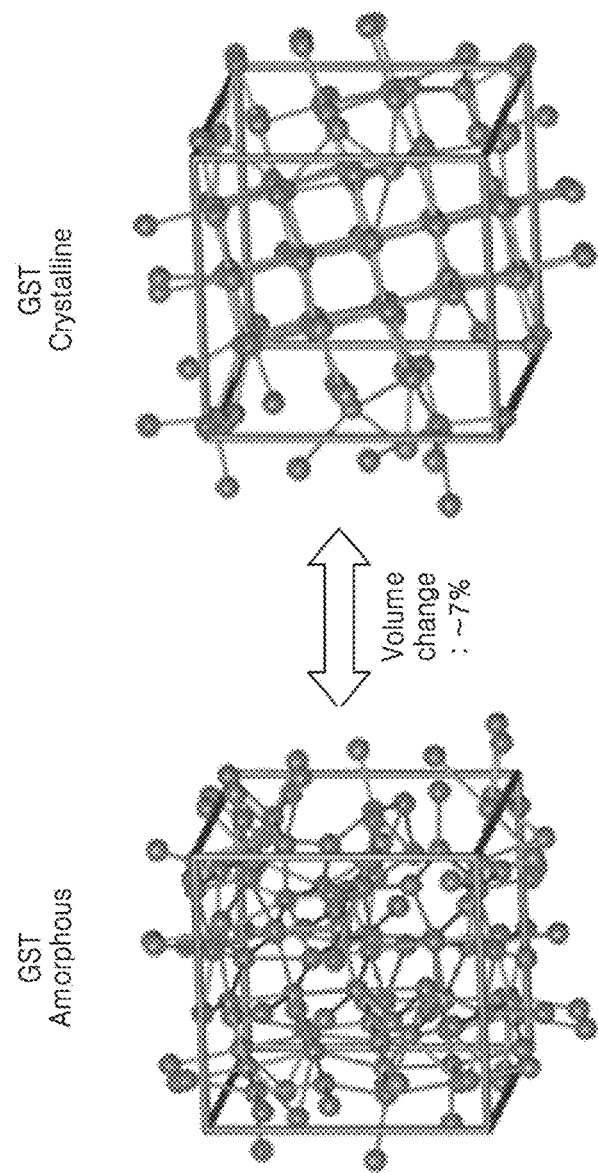
Figure 14:
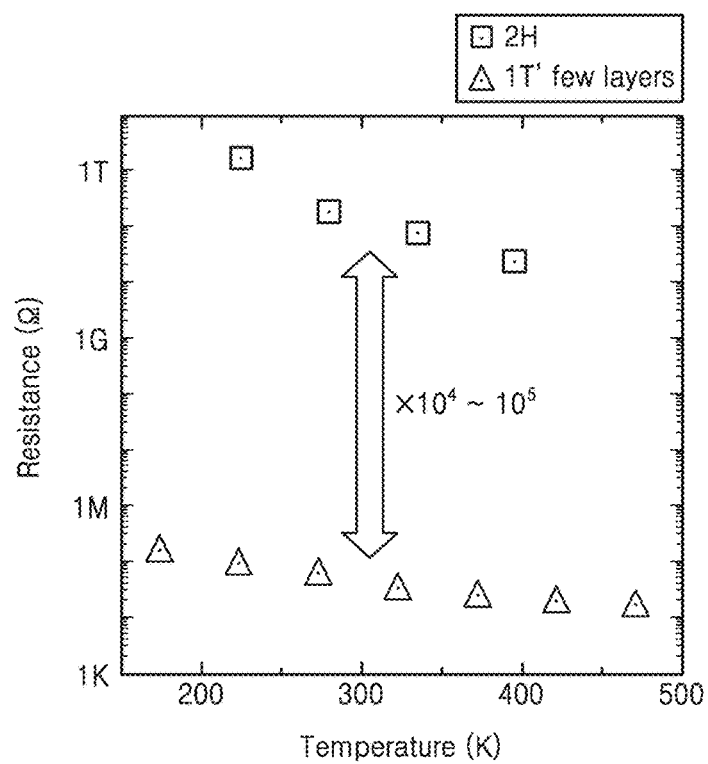
Figure 15:
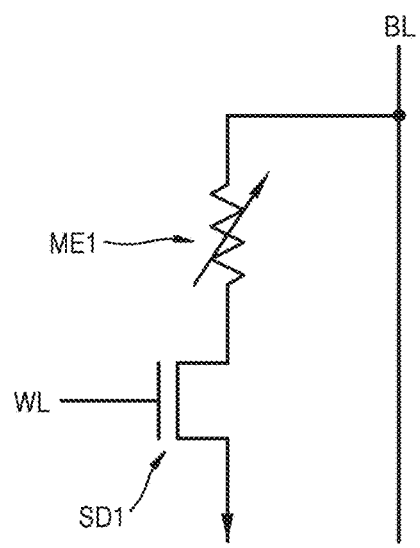
Figure 16:
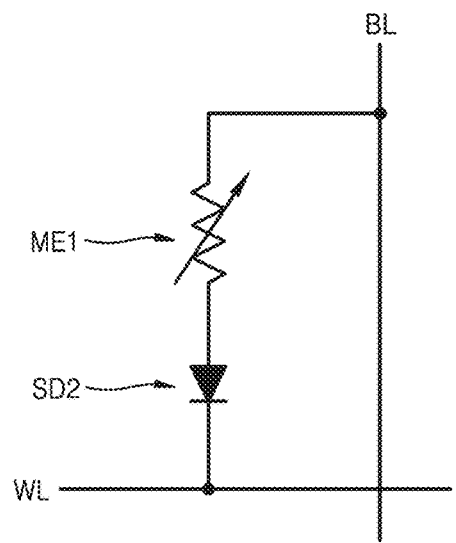
Figure 17:
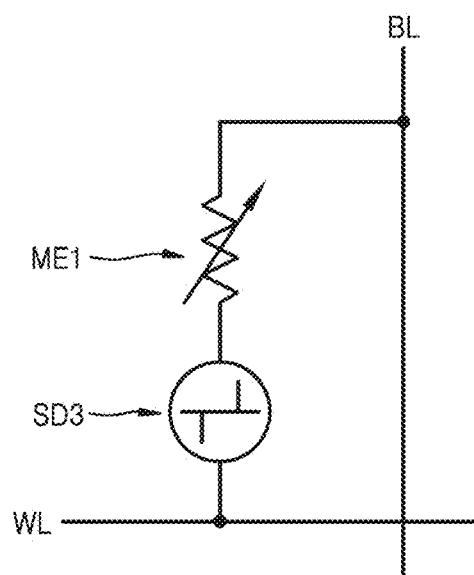
Figure 18:
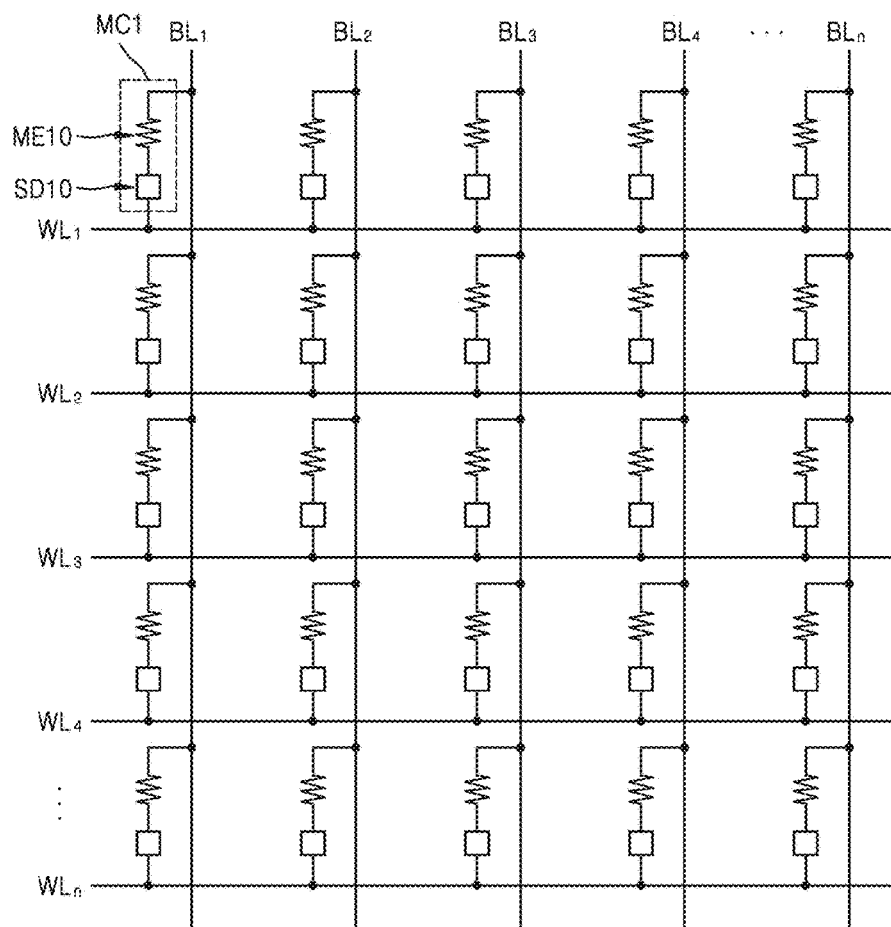
Figure 19:
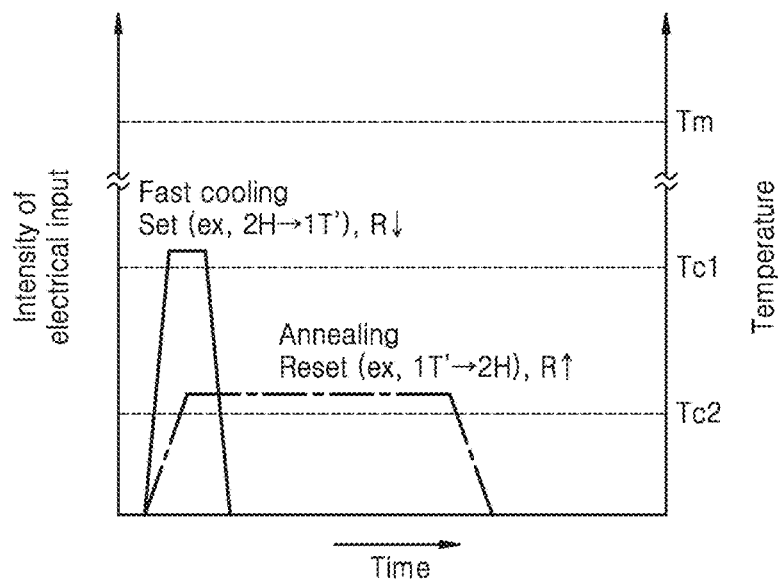
Figure 20:
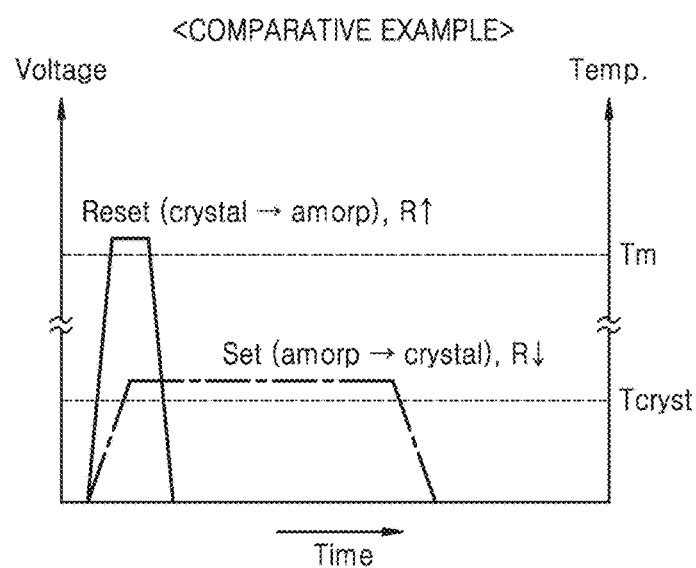
Figure 21:
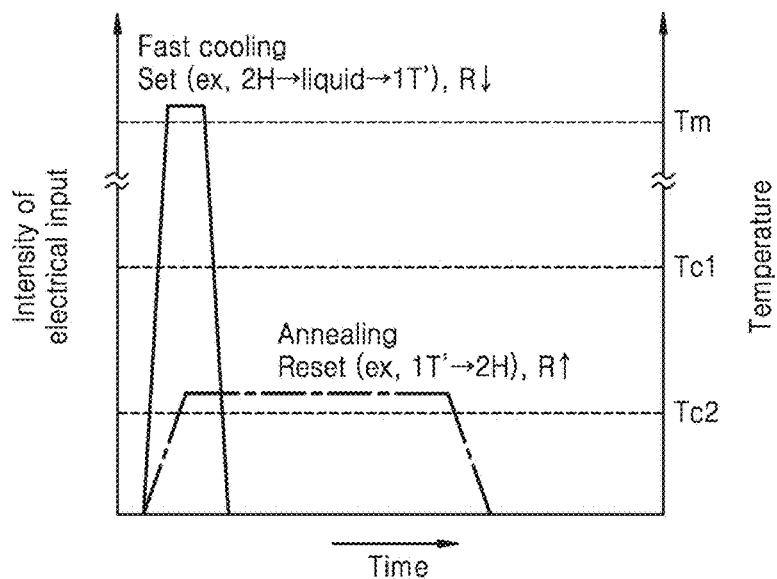
Figure 22:
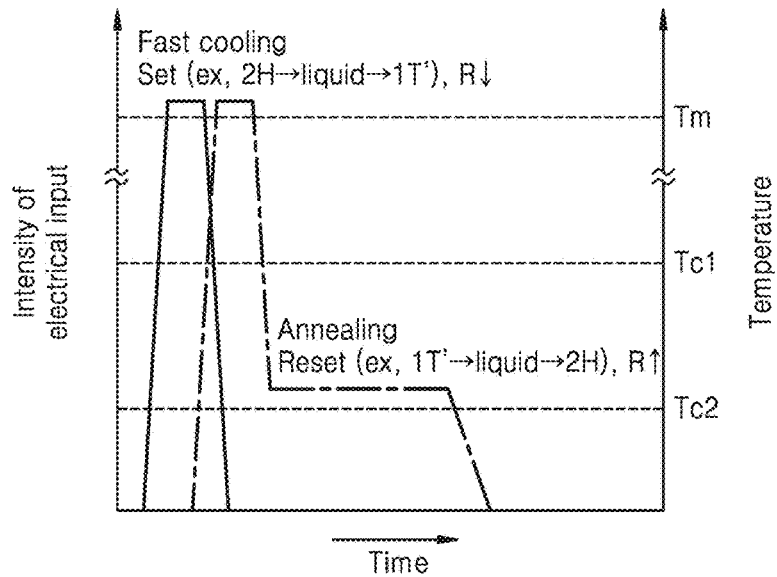
Figure 23:
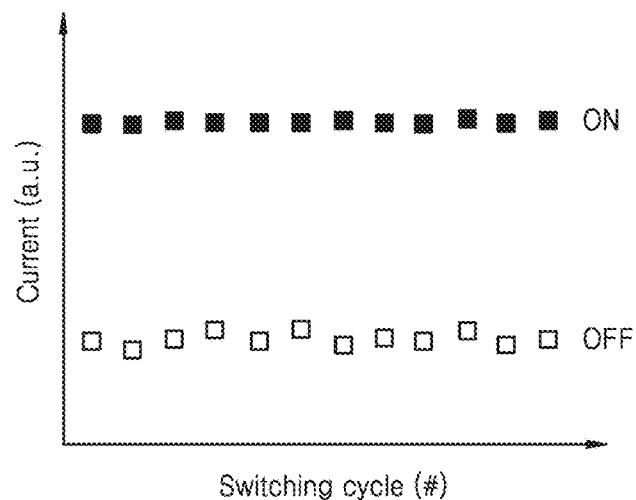
Figure 24:
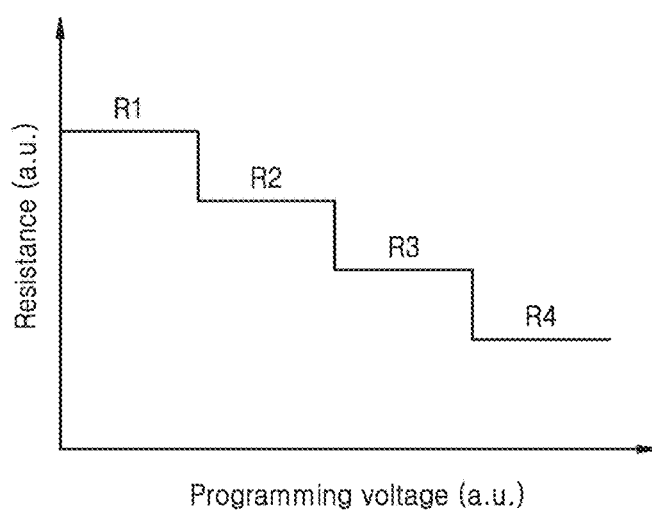
Figure 25:
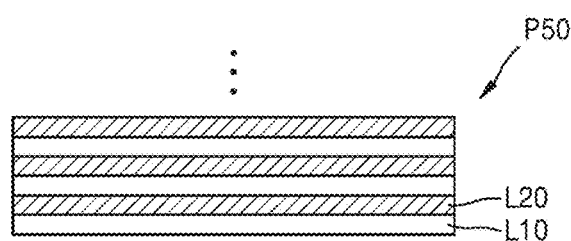
Figure 26:
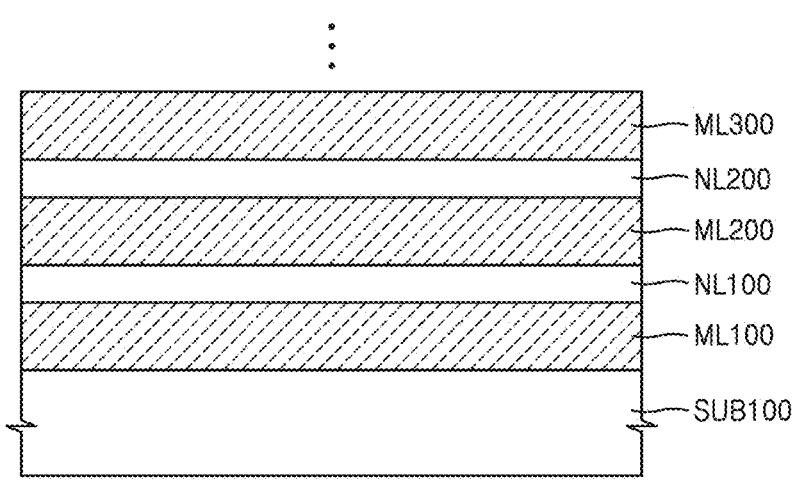
Figure 27:
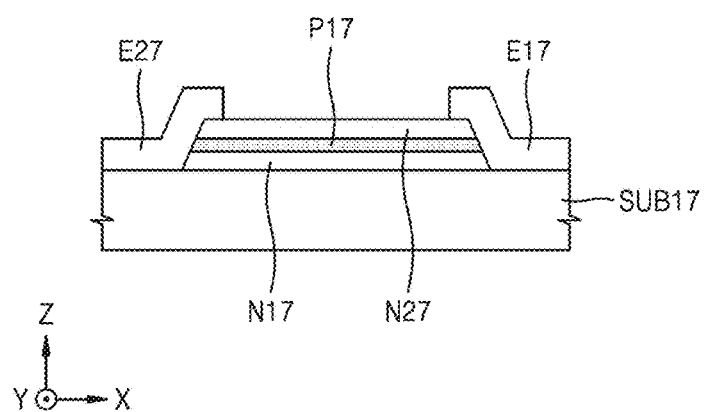
Figure 28:
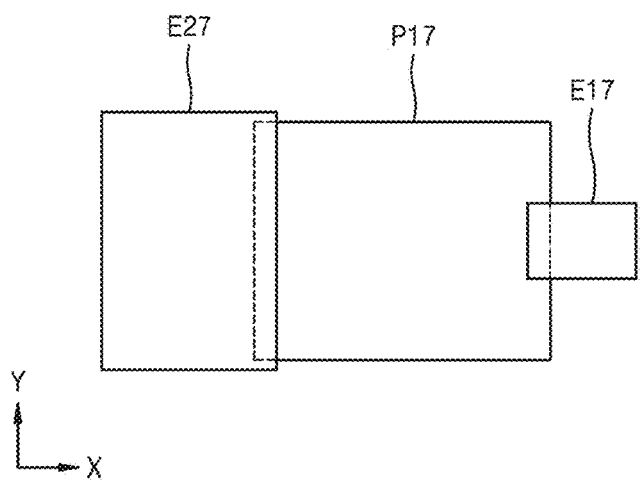
Figure 29:
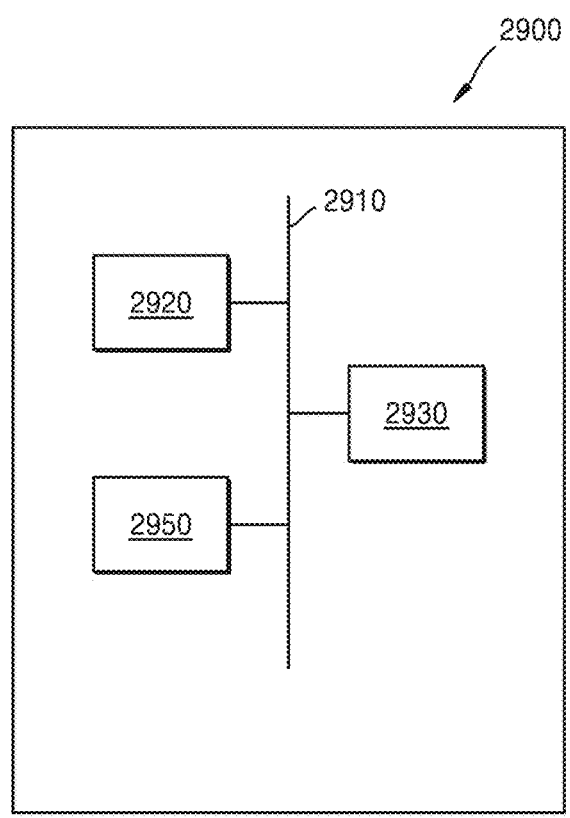

and a second crystalline structure (i.e., second crystalline phase) of a 2D material according to some example embodiments;

FIG. 5A and FIG. 5B are diagrams respectively illustrating a first crystalline structure (i.e., first crystalline phase) and a second crystalline structure (i.e., second crystalline phase) of a 2D material according to some example embodiments;

FIG. 6A and FIG. 6B are diagrams respectively illustrating a first crystalline structure (i.e., first crystalline phase) and a second crystalline structure (i.e., second crystalline phase) of a 2D material according to some example embodiments;

FIG. 7 is a plan view illustrating a phase change material according to some example embodiments;

FIG. 8A and FIG. 8B are diagrams illustrating a 2D material usable in a phase change layer according to some example embodiments;

FIG. 9A, FIG. 9B, FIG. 9C, and FIG. 9D are cross-sectional views illustrating a phase change memory device according to some example embodiments;

FIG. 10 is a cross-sectional view illustrating a phase change memory device according to some example embodiments;

FIG. 11 is a cross-sectional view illustrating a phase change memory device according to some example embodiments;

FIG. 12 is a diagram illustrating a volume change according to a phase change of a 2D material usable in a phase change material according to some example embodiments;

FIG. 13 is a diagram illustrating a volume change according to a phase change of a phase change material according to some example embodiments;

FIG. 14 is a graph illustrating the measurement results of a resistance variation according to a phase change of a phase change material according to some example embodiments;

FIG. 15 is a circuit diagram illustrating a circuit configuration of a phase change memory cell according to some example embodiments;

FIG. 16 is a circuit diagram illustrating a circuit configuration of a phase change memory cell according to some example embodiments;

FIG. 17 is a circuit diagram illustrating a circuit configuration of a phase change memory cell according to some example embodiments;

FIG. 18 is a circuit diagram illustrating an array structure of a phase change memory device according to some example embodiments;

FIG. 19 is a graph illustrating an operation of a phase change memory device using a phase change layer according to some example embodiments;

FIG. 20 is a graph illustrating an operation of a phase change memory device according to a comparative example;

FIG. 21 is a graph illustrating an operation of a phase change memory device according to some example embodiments;

FIG. 22 is a graph illustrating an operation of a phase change memory device according to some example embodiments;

FIG. 23 is a graph illustrating a change in ON and OFF currents according to a switching count number of a phase change memory device according to some example embodiments;

FIG. 24 is a graph illustrating a resistance change of a phase change layer according to a programming voltage of a phase change memory device according to some example embodiments;

FIG. 25 is a cross-sectional view illustrating a phase change layer usable in a phase change memory device according to some example embodiments;

FIG. 26 is a cross-sectional view illustrating a phase change memory device according to some example embodiments;

FIG. 27 is a cross-sectional view illustrating a phase change memory device according to some example embodiments;

FIG. 28 is a plan view illustrating an example of a plan structure of the phase change memory device of FIG. 27; and FIG. 29 is a diagram illustrating an electronic device 500 according to some example embodiments.

DETAILED DESCRIPTION

Reference will now be made in detail to example embodiments, one or more of which are illustrated in the accompanying drawings, wherein like reference numerals refer to like elements throughout, and thus descriptions will not be repeated. In this regard, the present example embodiments may have different forms and should not be construed as being limited to the descriptions set forth herein. Rather, the illustrated embodiments are provided as examples so that this disclosure will be thorough and complete, and will fully convey the concepts of this disclosure to those skilled in the art. Accordingly, the example embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Various example embodiments will now be described more fully with reference to the accompanying drawings in which example embodiments are shown.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below may be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features may then be oriented "above" the other elements or features. Thus, the exemplary term "below" may encompass both an orientation of above and below. The device may be otherwise oriented (rotated 90 degrees or at other orientations) and the spatially relative descriptors used herein may be interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "includes," "comprising," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When the terms "about" or "substantially" are used in this specification in connection with a numerical value, it is intended that the associated numerical value include a tolerance of ±10% around the stated numerical value. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure.

Hereinafter, phase change memory devices and methods of operating the same according to some example embodiments will be described in detail with reference to the accompanying drawings. The widths and thicknesses of layers or regions illustrated in the accompanying drawings may be exaggerated for clarity and convenience of description. Like reference numerals may denote like elements throughout the specification.

Figure 1:
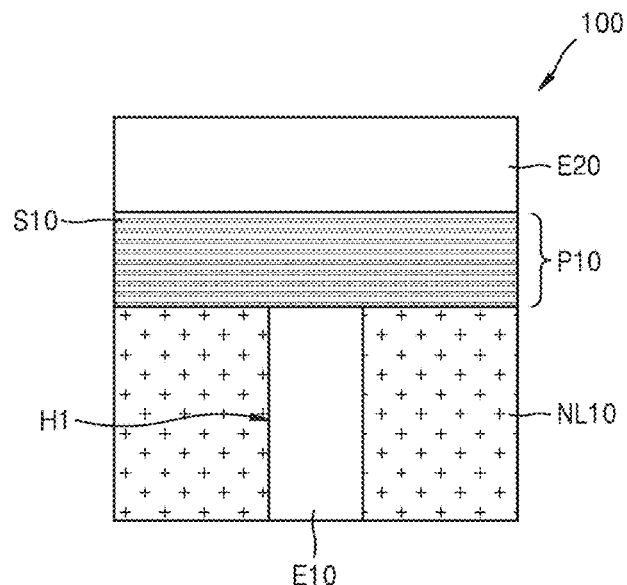
FIG. 1 is a cross-sectional view illustrating a phase change memory device according to some example embodiments.

FIG. 1 is a cross-sectional view of a phase change memory device 100 according to some example embodiments.

Referring to FIG. 1, a phase change memory device 100 may include a first electrode E10 and a second electrode E20 spaced apart from each other, and the phase change memory device 100 may further include a phase change layer P10 between the first electrode E10 and the second electrode E20. The first electrode E10 may be a bottom electrode. For example, the first electrode E10 may be a plug-type electrode. In some example embodiments, the phase change memory device 100 may include an interlayer insulating layer NL10, and the first electrode E10 may be in a contact hole H1 of the interlayer insulating layer NL10. Although not illustrated, a pad-type electrode contacting the first electrode E10 may be further provided on a bottom surface of the interlayer insulating layer NL10. The second electrode E20 may be a top electrode. The structure of the first and second electrodes E10 and E20 and the disposition relationship between the phase change layer P10 and the first and second electrodes E10 and E20 are merely examples and may vary according to some example embodiments.

The phase change layer P10 may include a two-dimensional (2D) material having a layered structure. Such a layered structure of the phase change layer P10, as shown in at least FIG. 1, may include a stack of one or more instances of 2D material S10. An individual instance S10 of 2D material S10, also referred to herein simply as the 2D material of the phase change layer P10, may be a single-layer or half-layer solid having a particular (or, alternatively, predetermined) crystalline structure of atoms. The 2D material of the phase change layer P10 may include a chalcogenide-based material having a 2D crystalline structure. The chalcogenide-based material may be a metal chalcogenide-based material or a non-metal chalcogenide-based material. The metal chalcogenide-based material may include at least one transition metal among the group consisting of Mo, Nb, and Co, and at least one chalcogen element among S, Se, and Te. The chalcogenide material including the transition metal may be, for example, $MoTe_x$, $CoTe_x$, or $NbS_x$. In some example embodiments, the metal chalcogenide-based material may be a chalcogenide-based material including a non-transition metal. The non-transition metal may include, for example, In, Tl, or Sn. That is, a compound of a chalcogen element such as S, Se, or Te and a non-transition metal such as In, Tl, or Sn may be used as the metal chalcogenide-based material. The chalcogenide material including the non-transition metal may include, for example, $SnS_x$, $In_xSe_y$, In—S, or Tl—Se. In some example embodiments, the chalcogenide-based material may be a non-metal chalcogenide-based material. The non-metal element of the non-metal chalcogenide-based material may include, for example, Ge. In some example embodiments, the non-metal chalcogenide-based material may include, for example, Ge—Te, Ge—S, or Ge—Se. Thus, the chalcogenide-based material may include at least one of $MoTe_x$, $CoTe_x$, $NbS_x$, $SnS_x$, $In_xSe_y$, In—S, Tl—Se, Ge—Te, Ge—S, and Ge—Se. The chalcogenide-based material may be a binary material. The $In_xSe_y$ may or may not have a composition ratio (x:y) of 2:3, and the In—S, Tl—Se, Ge—Te, Ge—S, and Ge—Se may or may not have a composition ratio of 1:1. The particular materials (elements) proposed herein are merely examples, and other materials (elements) may also be used.

The chalcogenide-based material used as the 2D material of the phase change layer P10 may be represented, for example, by a chemical formula of $MG_x$, where "M" denotes a metal element and "G" denotes a chalcogen element. If and/or when "x" in $MG_x$ is 2, $MG_x$ may be a transition metal dichalcogenide (TMD). In some example embodiments, the chemical formulation of the 2D material may be a formula unit (F.U.), also referred to herein as a chemical formula unit, of the 2D material. In some example embodiments, "x" may satisfy about $1.5 \leq x < 2$, and $MG_x$ may not strictly be referred to as TMD. In some example embodiments, if and/or when "x" satisfies about $1.5 \leq x < 2$, the 2D material (i.e., $MG_x$) may have a suitable level of phase change temperature (a critical temperature associated with a first phase changing phase into a second phase) and thus may exhibit excellent phase change characteristics and operation characteristics. As an example, the 2D material (i.e., $MG_x$) of the phase change layer P10 may have a phase change temperature of about 200° C. to about 500° C. or a phase change temperature of about 300° C. to about 500° C. In this regard, the 2D material (i.e., $MG_x$) may be advantageous to secure high operation (read/write) speed and excellent data retention characteristics in the phase change memory device 100.

The phase change temperature of $MoTe_2$ may be about 850° C., the phase change temperature of $NbS_2$ may be about 850° C., the phase change temperature of $CoTe_2$ may be about 760° C., the phase change temperature of $SnS_2$ may be about 660° C., the phase change temperature of GeSe may be about 660° C., and the phase change temperature of GeS may be about 600° C. By changing a composition ratio of $MoTe_2$, $NbS_2$, $CoTe_2$, $SnS_2$, GeSe, and GeS, adding a particular (or, alternatively, predetermined) dopant, or mixing with other materials, the phase change temperature thereof may be controlled to a suitable level and the melting temperature thereof may be reduced. The phase change temperature of InS may be about 410° C., the phase change temperature of GeTe may be about 370° C., the phase change temperature of $In_2Se_3$ may be about 220° C., and the phase change temperature of TlSe may be about 200° C. Also, in this case, by changing a composition ratio thereof, adding a particular (or, alternatively, predetermined) dopant, or mixing with other materials, the phase change temperature thereof may be controlled and the melting temperature thereof may be reduced. In this regard, according to some example embodiments, the phase change layer P10 including a 2D material having a phase change temperature of about 200° C. to about 500° C. may be implemented and used in the phase change memory device 100. Thus, a phase change memory device 100 having excellent data retention characteristics (i.e., data endurance) and high operation speed may be implemented. In some example embodiments, the phase change temperature of the 2D material (phase change material) is not necessarily limited to about 200° C. to about 500° C., and the range of the phase change temperature may vary according to some example embodiments. Also, if and/or when the 2D material is $MG_x$, "x" may not necessarily satisfy about $1.5 \leq x < 2$, and a range of "x" may vary according to some example embodiments. For example, in some example embodiments, "x" may satisfy about $2 < x \leq 2.5$ or about $2 \leq x \leq 2.5$.

Although example embodiments where the 2D material of the phase change layer P10 is mainly the chalcogenide-based material has been described above, the 2D material of the phase change layer P10 may also be another material other than the chalcogenide-based material. For example, the 2D material of the phase change layer P10 may be phosphorene. This will be described later in more detail with reference to FIGS. 8A and 8B.

The phase change layer P10 may include a single-layer 2D material (e.g., an individual instance S10) or may have a repeated stack structure of a single layer having a 2D crystalline structure (e.g., a stack of multiple instances S10). Even when the single layer ("instance S10") is repeatedly stacked, the characteristics of the 2D material may be maintained. In an electronic structure, the 2D material may be defined as a material having a density of state (DOS) conforming to a quantum well behavior. A material with a stack of 2D unit material layers (about 100 or less layers) may also have a DOS conforming to a quantum well behavior. In this regard, the repeated stack structure of the single layer may also be referred to as a "2D material". In the repeated stack structure of the single layer ("instance S10"), the single layers ("instances S10") may be combined by the van der Waals force. Thus, the 2D material of the phase change layer P10 may have a layered structure. The layered structure may be a single-layer layered structure (e.g., phase change layer P10 may include an individual instance S10) or a multi-layer layered structure (e.g., phase change layer P10 may include a stack of multiple instances S10).

The phase of a 2D material instance S10 of the phase change layer P10 may be changed by an electrical signal applied to the phase change layer P10 through the first electrode E10 and the second electrode E20. The phase change layer P10 may have a first crystalline phase, and the phase of at least a portion of the phase change layer P10 may be changed from the first crystalline phase to a second crystalline phase by the applied electrical signal. This will be described below with reference to FIG. 2.

Figure 2:
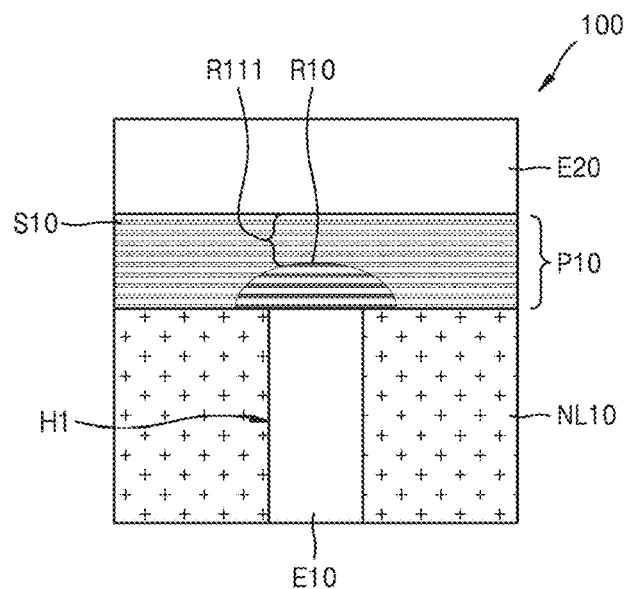
FIG. 2 is a cross-sectional view illustrating a phase change memory device according to some example embodiments.

FIG. 2 is a cross-sectional view illustrating a phase change memory device according to some example embodiments.

Referring to FIG. 2, if and/or when a particular (or, alternatively, predetermined) electrical signal (electrical energy) is applied to the phase change layer P10 of the phase change memory device 100 through the first electrode E10 and the second electrode E20, the phase of the 2D material in at least a portion of the phase change layer P10 may change from the first crystalline phase to the second crystalline phase. In the example embodiments shown in FIG. 2, a reference numeral "R10" denotes a phase change region of the phase change layer P10 that is a region where the phase changes. The phase of the phase change region R10 may be the second crystalline phase, and the phase of the remaining region R111 other than the phase change region R10 in the phase change layer P10 may be the first crystalline phase. As shown in FIG. 2, the phase change region R10 may include at least a portion of one or more instances ("layers") S10 of 2D material. The remaining region R111 may include at least a portion of one or more instances S10 of 2D material. In some example embodiments the phase change region R10 may include an entirety of one or more instances S10 of 2D material of the phase change layer P10. As shown in FIG. 2, where the phase change region R10 is a limited portion of the phase change layer P10, the phase change region 10 may include a limited portion of one or more instances S10 of 2D material, and the remaining region R111 may include a separate limited portion of the same one or more instances S10 of 2D material and may further include an entirety of one or more additional instances S10 of 2D material of the phase change layer P10. An operation of forming the phase change region R10 in the phase change layer P10 may be referred to as a set operation. The resistance (electric resistance) of the phase change layer P10 may be reduced based on the set operation.

In some example embodiments, if and/or when the phase change region R10 is formed, when an electrical signal different from the particular (or, alternatively, predetermined) electrical signal is applied to the phase change layer P10, the phase of the phase change region R10 may change again. That is, the phase of the phase change region R10 may change from the second crystalline phase to the first crystalline phase. Consequently, the phase change layer P10 may have the first crystalline phase in an entire region, i.e., an entirety of the phase change layer P10 may be in the first crystalline phase. In other words, the phase change layer P10 of FIG. 2 may change again like the phase change layer P10 of FIG. 1. An operation of changing the phase of the phase change region R10 from the second crystalline phase into the first crystalline phase, that is, an operation of changing the phase change layer P10 of FIG. 2 again like the phase change layer P10 of FIG. 1 may be referred to as a reset operation. The resistance (electric resistance) of the phase change layer P10 may be increased by the reset operation. The shape and range (size) of the phase change region R10 illustrated in FIG. 2 are merely examples and may vary according to various embodiments.

Figure 3:
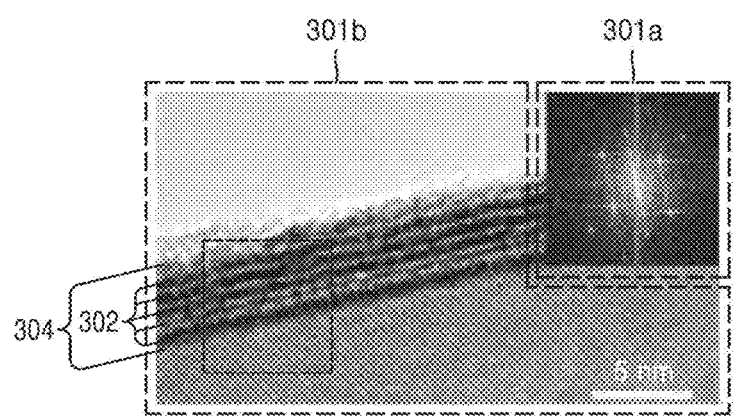
FIG. 3 illustrates a transmission electron microscope (TEM) image showing a two-dimensional (2D) material layer on a substrate and a TEM diffraction pattern associated with the 2D material layer according to some example embodiments.

FIG. 3 includes a transmission electron microscope (TEM) image 301b showing a 2D material layer on a substrate and a TEM diffraction pattern 301a associated with the 2D material layer, according to some example embodiments. The 2D material layer may be included in a phase change layer according to some example embodiments. In the example embodiments shown in FIG. 3, the 2D material layer is a MoTe$_x$ layer.

Referring to FIG. 3, in some example embodiments the MoTe$_x$ layer has a 2D layered structure. As shown in FIG. 3, in some example embodiments, the MoTe$_x$ layer illustrated in image 301b includes a stack 304 of mono-layers 302, each mono-layer 302 having a thickness of about 0.75 nm. In some example embodiments, a mono-layer 302 may be an instance S10 of 2D material as illustrated and described with regard to at least FIG. 1 and FIG. 2. The stack 302 of mono-layers may be a phase change layer P10 as illustrated and described with regard to at least FIG. 1 and FIG. 2. FIG. 3 further illustrates a TEM diffraction pattern 301a associated with the MoTe$_x$ layer in the top right of FIG. 3. The crystalline structure of the MoTe$_x$ layer shown in FIG. 3 may be identified through this diffraction pattern.

Even when the phase change layer is formed of (e.g., at least partially comprises) materials including GeTe, GeSe, and GeS, the materials including GeTe, GeSe, and GeS may not necessarily have a 2D crystalline structure and a layered structure. Thus, not all the GeTe materials, not all the GeSe materials, or not all the GeS materials may have a 2D structure. Materials including as Ge—Te, Ge—Se, and Ge—S having a 2D structure (layered structure) may be formed by using a particular (or, alternatively, predetermined) process and condition. When these materials have a 2D structure (including a layered structure), they may exhibit characteristics/properties significantly different from those in the case of not having a 2D structure (layered structure). This may also be true in other materials (e.g., MoTe$_x$, CoTe$_x$, NbS$_x$, SnS$_x$, In$_x$Se$_y$, In—S, and Tl—Se) than these materials.

In some example embodiments, a 2D material included in a phase change layer according to some example embodiments may have a low thermal conductivity, such that the phase change layer is at least partially associated with a low thermal conductivity. For example, the 2D material may have a thermal conductivity of about 1 W/(m·K) or less. If and/or when the thickness of the 2D material is small, the 2D material may have a low thermal conductivity of about 0.1 W/(m·K) or less. Also in this regard, the 2D material according to some example embodiments may be advantageously (suitably) included in the phase change material of a phase change memory device, including the phase change memory device 100 of FIG. 1.

Figure 4A:
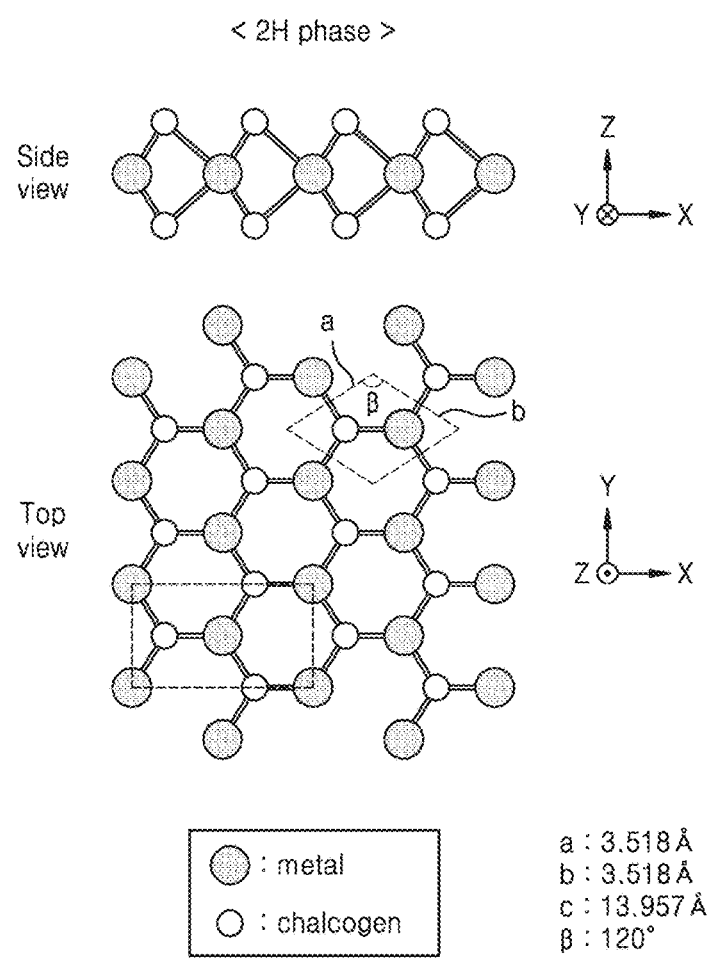
FIG. 4A and FIG. 4B are diagrams respectively illustrating a first crystalline structure (i.e., first crystalline phase)

FIG. 4A is a diagram illustrating a first crystalline structure (i.e., first crystalline phase) of a 2D material usable according to some example embodiments. The 2D material may be included in a phase change layer, including the phase change layer P10 shown in at least FIG. 1. For convenience, it is assumed that the 2D material of some example embodiments is MG$_x$, where "x" is 2. The MG$_x$ may be MoTe$_x$. FIG. 4A includes a structure viewed from the side (i.e., a side view) and a structure viewed from the top (i.e., a top view). This is also true in FIG. 4B.

Referring to FIG. 4A, the first crystalline structure of the 2D material (MG$_x$) may be, for example, a 2H structure (i.e., 2H phase). Lattice constants a, b, and c of the 2H structure may be respectively 3.518 Å, 3.518 Å, and 13.957 Å, and an angle β between the lattices may be 120°. Herein, the constant c (not illustrated) represents the lattice constant in a Z-axis direction.

Figure 4B:
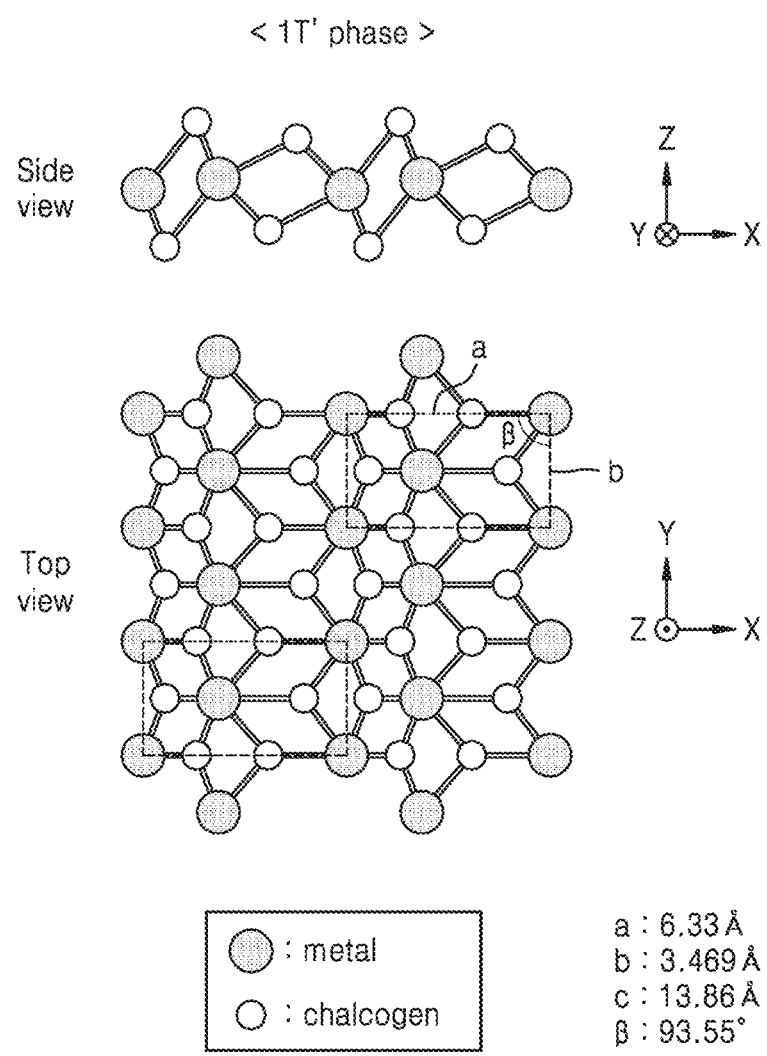

FIG. 4B is a diagram illustrating a second crystalline structure (i.e., second crystalline phase) of a 2D material according to some example embodiments. The 2D material may be included in a phase change layer, including the phase change layer 10 shown in at least FIG. 1. For convenience, it is assumed that the 2D material of some example embodiments is MG$_x$, where "x" is 2. The MG$_x$ may be MoTe$_x$.

Referring to FIG. 4B, the second crystalline structure of the 2D material (MG$_x$) may be, for example, a 1T' structure (i.e., 1T' phase). Lattice constants a, b, and c of the 1T' structure may be respectively 6.33 Å, 3.469 Å, and 13.86 Å, and an angle β between the lattices may be 93.55°. Herein, "c" represents the lattice constant in a Z-axis direction.

The first crystalline structure (crystalline phase) of FIG. 4A and the second crystalline structure (crystalline phase) of FIG. 4B may correspond to, for example, two crystalline structures (crystalline phases) of the 2D material of the phase change layer P10 of FIG. 1. For example, the phase change layer P10 of FIG. 1 may have the crystalline structure of FIG. 4A in a whole region, and the phase change region R10 of FIG. 2 may have the crystalline structure of FIG. 4B. The 2D material having the crystalline structure (2H phase) of FIG. 4A may have semiconductor characteristics, and the 2D material having the crystalline structure (1T' phase) of FIG. 4B may have conductor (metal) characteristics or semi-metal characteristics. Thus, the electric resistance may vary according to the crystalline structure (crystalline phase) of the 2D material.

Since the crystalline structure illustrated in FIGS. 4A and 4B illustrates the example embodiments where "x" in MG$_x$ is 2. In some example embodiments, the crystalline structure may include MG$_x$ where "x" satisfies about 1.5 and the crystalline structure may be different from the crystalline structure illustrated in FIGS. 4A and 4B. However, even in such example embodiments, an expression of 2H structure (2H phase) and an expression of 1T' structure (1T' phase) may be effectively used.

FIGS. 5A and 5B are diagrams respectively illustrating a first crystalline structure (i.e., first crystalline phase) and a second crystalline structure (i.e., second crystalline phase) of a 2D material according to some example embodiments. It is assumed that the 2D material of some example embodiments is In—S, where a composition ratio of In and S is 1:1. The 2D material may be included in a phase change layer, including the phase change layer P10 shown in at least FIG. 1.

FIG. 5A illustrates a $D_{3h}$ phase that is the first crystalline phase of In—S, and FIG. 5B illustrates a $D_{3d}$ phase that is the second crystalline phase of In—S. The phase of In—S may be changed between the $D_{3h}$ phase and the $D_{3d}$ phase by the electrical energy applied to In—S. The electric resistance of In—S may vary according to the crystalline phase of In—S. Herein, although the case where a composition ratio of In and S in In—S is 1:1 has been illustrated and described, the composition ratio is not limited to 1:1 and may vary according to some example embodiments. Even in the case where the composition ratio of In and S in In—S is not 1:1, since the structure of the $D_{3h}$ phase or the structure of the $D_{3d}$ phase is substantially maintained, the expressions of $D_{3h}$ phase and $D_{3d}$ phase may be effectively used.

FIGS. 6A and 6B are diagrams respectively illustrating a first crystalline structure (i.e., first crystalline phase) and a second crystalline structure (i.e., second crystalline phase) of a 2D material according to some example embodiments. It is assumed that the 2D material of some example embodiments is $In_xSe_y$, and a composition ratio (x:y) of In and Se is 2:3. The 2D material may be included in a phase change layer, including the phase change layer P10 shown in at least FIG. 1.

FIG. 6A illustrates an α phase that is the first crystalline phase of $In_xSe_y$, and FIG. 6B illustrates a β phase that is the second crystalline phase of $In_xSe_y$. The phase of $In_xSe_y$ may be changed between the α phase and the β phase by the electrical energy applied to $In_xSe_y$. The electric resistance of $In_xSe_y$ may vary according to the crystalline phase of $In_xSe_y$. Herein, although the case where a composition ratio (x:y) of In and Se in $In_xSe_y$ is 2:3 has been illustrated and described, the composition ratio (x:y) is not limited to 2:3 and may vary according to some example embodiments.

A current density (i.e., a programming current density) necessary to change the phase of the 2D material (phase change material) described with reference to FIGS. 4A, 4B, 5A, 5B, 6A, and 6B may be about $10^6$ A/cm$^2$ or more. The programming current density may be, for example, about $10^7$ A/cm$^2$. The programming current density may be a level suitable for use in the phase change memory device.

FIG. 7 is a plan view illustrating a phase change material according to some example embodiments. The phase change material may be included in a phase change layer, including the phase change layer P10 shown in FIG. 1.

Referring to FIG. 7, a phase change layer P15 may include a 2D material of a layered structure, and the 2D material may include a first chalcogenide-based material M15 and a second chalcogenide-based material M25. In other words, the phase change layer P15 may include a mixture of the first chalcogenide-based material M15 and the second chalcogenide-based material M25. A plurality of first chalcogenide-based materials M15 and a plurality of second chalcogenide-based materials M25 may be arranged randomly and irregularly. The first chalcogenide-based material M15 and the second chalcogenide-based material M25 may have irregular shapes. When performing a process of forming the first chalcogenide-based material M15 and the second chalcogenide-based material M25 while simultaneously providing a source material of the first chalcogenide-based material M15 and a source material of the second chalcogenide-based material M25 onto a substrate, the first chalcogenide-based material M15 and the second chalcogenide-based material M25 may be formed at random positions while having irregular shapes. However, in some example embodiments, the first chalcogenide-based material M15 and the second chalcogenide-based material M25 may be regularly arranged while having regular shapes.

The first chalcogenide-based material M15 or the second chalcogenide-based material M25 may correspond to the chalcogenide-based material described with reference to FIG. 1. For example, the first chalcogenide-based material M15 may be one of $MoTe_x$, $CoTe_x$, $NbS_x$, $SnS_x$, $In_xSe_y$, In—S, Tl—Se, Ge—Te, Ge—S, and Ge—Se, and the second chalcogenide-based material 25 may be a material different from the first chalcogenide-based material M15. As an example, the first chalcogenide-based material M15 may be $MoTe_x$, and the second chalcogenide-based material M25 may be $WTe_x$. The "x" in $MoTe_x$ may satisfy about 1.5≤x<2, and the "x" in $WTe_x$ may satisfy about 1.5≤x≤2.5. In some example embodiments, the "x" in $MoTe_x$ may satisfy about 1.5≤x≤2.5, and the "x" in $WTe_x$ may also satisfy about 1.5≤x≤2.5. In this manner, if and/or when the phase change layer P15 is formed based on mixing different chalcogenide-based materials M15 and M25, the phase change temperature associated with the phase change layer P15 may be easily adjusted to a suitable level. For example, the phase change layer P15 may have (e.g., be associated with) a phase change temperature of about 200° C. to about 500° C. or a phase change temperature of about 300° C. to about 500° C. Herein, although the example embodiments where the first chalcogenide-based material M15 is $MoTe_x$ and the second chalcogenide-based material M25 is $WTe_x$ has been mainly described, these materials may vary according to some example embodiments. In some example embodiments, a phase change layer P10 may include a plurality of 2D structures stacked in a vertical direction, where the plurality of 2D structures each may have the structure as illustrated in FIG. 7 or the like.

When the phase change layer P15 illustrated in FIG. 7 is included in the phase change layer P10, since only any one of the first chalcogenide-based material M15 and the second chalcogenide-based material M25 may be selectively phase-changed, the size of an effective region where a phase change occurs (e.g., region R10 in the phase change layer P10 shown in FIG. 2) may be reduced (e.g., reduced in relation to a size of the remaining region R111). Also, in some cases, the first chalcogenide-based material M15 may be phase-changed in a first operation, and the second chalcogenide-based material M25 may be phase-changed in a second operation. Thus, it may be advantageous to secure excellent performance and implement various operation characteristics.

FIGS. 8A and 8B are diagrams illustrating a 2D material according to some example embodiments. The 2D material may be included in a phase change layer, including the phase change layer P10 shown in FIG. 1. In some example embodiments, including the example embodiments illustrated in FIGS. 8A and 8B, the 2D material is phosphorene. FIG. 8A illustrates the first crystalline structure (i.e., first crystalline phase) of phosphorene, and FIG. 8B illustrates the second crystalline structure (i.e., second crystalline phase) of phosphorene.

Referring to FIG. 8A, the first crystalline structure of phosphorene may be, for example, a black phase. In a side view of the black phase, a phosphorus (P) element located at a relatively upper side and a P element located at a relatively lower side are represented by different colors for convenience. Thus, a relative position of a P element in a Z-axis direction may be identified also in a top view. This is also applied to FIG. 8B.

Referring to FIG. 8B, the second crystalline structure of phosphorene may be, for example, a blue phase. In both a side view and a top view, the blue phase may have a different structure from the black phase of FIG. 8A.

Phosphorene having the black phase of FIG. 8A may have (e.g., be associated with) a relatively low resistance (Low R), and phosphorene having the blue phase of FIG. 8B may have a relatively high resistance (High R). According to the electrical signal (energy) applied to phosphorene, the phase thereof may change between the black phase and the blue phase. For example, a current density (i.e., a programming current density) necessary to change the phase of phosphorene may be about $10^6$ A/cm$^2$ or more. The programming current density may be, for example, about $10^7$ A/cm$^2$. The programming current density may be suitable for use in the phase change memory device 100.

The phase change layers P10 and P15 described above may further include an intercalation material included in the layered structure of the 2D material. The intercalation material may be between layers of the layered structure. The intercalation material may include, for example, Li. The phase change temperature of the 2D material may be suitably controlled by the intercalation material, and other characteristics thereof may also be adjusted.

Also, the phase change layers P10 and P15 may further include a dopant added to the 2D material. Unlike the intercalation material described above, the dopant may be provided in the layer structure of the 2D material. The dopant may include, for example, at least one of N, O, Si, and W. The phase change temperature of the 2D material may be suitably controlled by the dopant, and other characteristics thereof may also be adjusted.

The phase change layer P10 of FIG. 1 may have a thickness of, for example, about 50 nm or less. If and/or when the phase change layer P10 includes a chalcogenide-based 2D material, a single-layer chalcogenide-based material may have a thickness of about 0.75 nm. When the phase change layer P10 includes phosphorene, a single-layer phosphorene may have a thickness of about 0.34 nm. Since the phase change layer P10 may have a layered structure including a plurality of single layers (i.e., 2D layers), the thickness of the phase change layer P10 may increase as the number of layers (2D layers) constituting the layered structure increases. In this regard, the phase change layer P10 may have a thickness of about 50 nm or less. Even when the total thickness of the phase change layer P10 is as large as about 50 nm, the thickness of an effective phase change region (i.e., a region where an effective phase change occurs) may be relatively small. For example, the thickness of the effective phase change region may be about 25 nm or less or about 10 nm or less. However, the total thickness of the phase change layer P10 and the thickness of the effective phase change region described herein are merely examples and may vary according to some example embodiments. In some cases, the phase change layer P10 may have a thickness of about 50 nm or more.

Although FIG. 1 illustrates example embodiments of a phase change memory device 100 that includes a layer (i.e., 2D layer) S10 of the 2D material included in the phase change layer P10 that extends in parallel or substantially in parallel (e.g., parallel within manufacturing tolerances and/or material tolerances) to a surface of a substrate (not illustrated), the layer (i.e., 2D layer) may extend in perpendicular or substantially in perpendicular (e.g., perpendicular within manufacturing tolerances and/or material tolerances) to the surface of the substrate (not illustrated). An example thereof is illustrated in FIGS. 9A-9D.

Figure 9A:
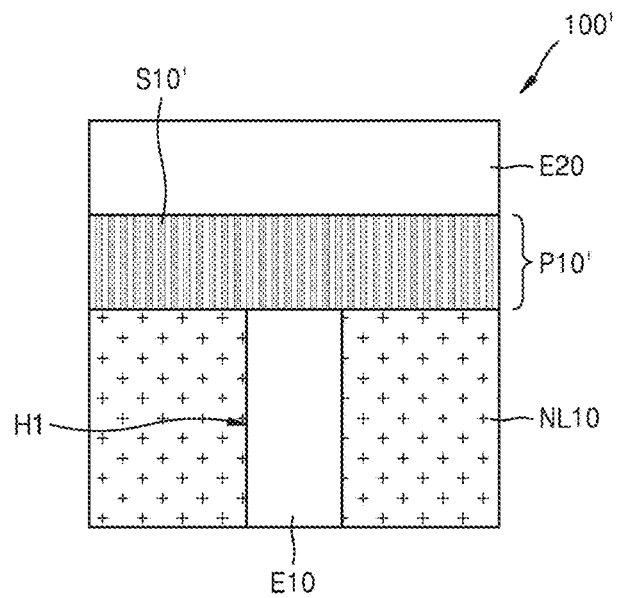

FIG. 9A, FIG. 9B, FIG. 9C, and FIG. 9D are cross-sectional views illustrating a phase change memory device according to some example embodiments Referring to FIG. 9A, a phase change memory device 100' may include a phase change layer P10' between a first electrode E10 and a second electrode E20. The phase change layer P10' may include a 2D material having a layered structure. A layer (i.e., 2D layer, "instance," etc.) S10' at least partially comprising the layered structure of the phase change layer P10' may be arranged to extend in perpendicular or substantially in perpendicular to a surface of a substrate (not illustrated). The formation direction of the layer S10' (i.e., 2D layer) may vary according to process conditions. Based on adjusting the process conditions, the layer S10' may be formed to extend in perpendicular or substantially in perpendicular to the substrate (not illustrated). This may be the same as well-known in the art of a 2D material forming process, and thus detailed descriptions thereof will be omitted for conciseness.

Also, although not illustrated, a phase change layer including both the layer (i.e., 2D layer) S10' extending in perpendicular to the substrate and the layer (i.e., 2D layer) S10 extending in parallel to the substrate may be included in some example embodiments. A phase change layer having a structure where the layer (i.e., 2D layer) S10' extends in perpendicular to the substrate and the layer (i.e., 2D layer) S10 parallel to the substrate are randomly disposed may be formed, and it may be used in the phase change memory device.

In FIGS. 1 and 9, the first electrode E10 and the second electrode E20 may include an electrode material used in the art of a general phase change memory. For example, at least one of the first electrode E10 and the second electrode E20 may include at least one of various conductive materials including TiN (titanium nitride), TaN (tantalum nitride), WN (tungsten nitride), WNC (tungsten nitride carbide), and doped-Si. The first electrode E10 may be referred to as a bottom electrode, and may also be referred to as a heating electrode or a resistive electrode. The second electrode E20 may be referred to as a top electrode.

Figure 9B:
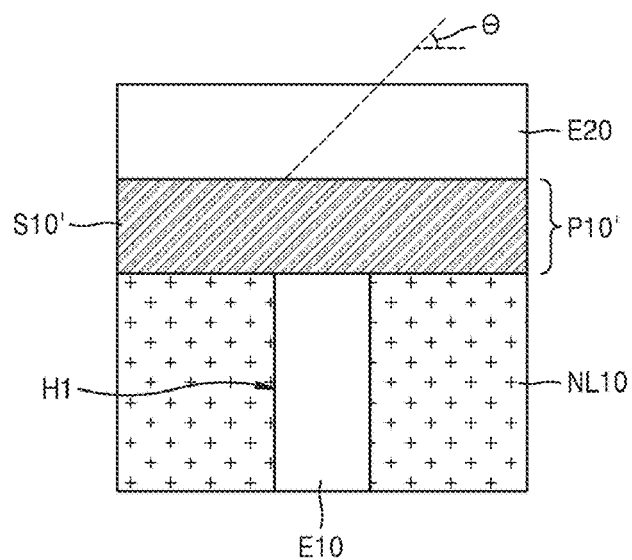

Referring to FIG. 9B, in some example embodiments, the phase change layer P10' may include a layered structure of 2D layers S10' that extend at an angle with regard to a surface of a substrate (not illustrated), such that the 2D layers S10' extend in parallel with each other and further extend neither in parallel nor perpendicular to the surface of the substrate. As shown in FIG. 9B, for example, the 2D layers may extend at an angle θ with regard to a surface of the substrate. The layered structure of the phase change layer P10' may be formed based on forming the layered structure of 2D layers S10' in a stack on a given substrate (e.g., an angled substrate), mold, etc. and then segmenting, cutting, etc. one or more of the 2D layers to form the layered structure as shown in FIG. 9B.

Figure 9C:
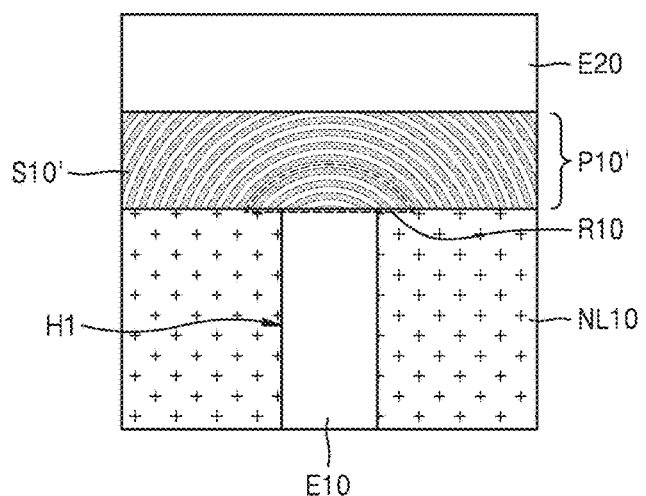
Figure 9D:
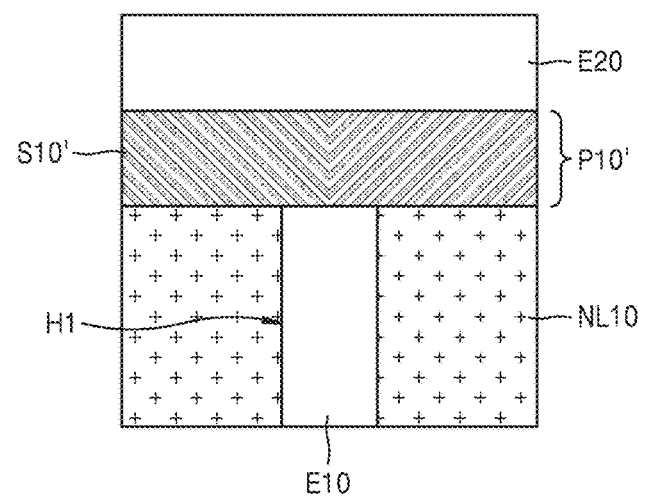

Referring to FIGS. 9C and 9D, in some example embodiments, the phase change layer P10' may include a layered structure of 2D layers S10' that extend in a non-planar pattern, curvature, etc.

Referring to FIG. 9C, in some example embodiments, the phase change layer P10' may include a layered structure of 2D layers S10' that extend along a curvature. The curvature may be a two-dimensional curvature and/or a three-dimensional curvature. The layered structure may be formed based on forming the 2D layers S10' on a curved substrate, mold, etc. and then segmenting, cutting, etc. one or more of the 2D layers to form the layered structure as shown in FIG. 9C.

As further shown in FIG. 9C, in some example embodiments the curvature associated with the 2D layers S10' may be associated with a relative positioning of the phase change layer P10' in relation to one or more of the electrodes E10, E20. As shown in FIG. 9C, the layered structure of 2D layers S10' may extend in a curvature associated with the relative position of electrode E10 with regard to the phase change layer P10', such that the phase change region R10 encompasses an entirety of one or more curved 2D layers S10' and the remaining region R111 encompasses an entirety of one or more additional curved 2D layers.

Referring to FIG. 9D, in some example embodiments, the phase change layer P10' may include a layered structure of 2D layers S10' that extend according to a non-linear pattern. The pattern may be a two-dimensional pattern and/or a three-dimensional pattern. As shown in FIG. 9D, for example, the pattern may be a Zig-Zag pattern. The layered structure may be formed based on forming the 2D layers S10' on a substrate, mold, etc. that exhibits the pattern and then segmenting, cutting, etc. one or more of the 2D layers to form the layered structure as shown in FIG. 9D.

FIG. 10 is a cross-sectional view illustrating a phase change memory device 100'' according to some example embodiments.

Referring to FIG. 10, the phase change memory device 100'' may include a first electrode E11 that may include an electrode portion EP1 of a pad or layer shape and a plug-type electrode portion EP2 provided on the electrode portion EP1. The plug-type electrode portion EP2 may be provided in an interlayer insulating layer NL11. The plug-type electrode portion EP2 may contact the bottom surface of a phase change layer P11 and have a smaller width than the phase change layer P11. The phase change memory device 100'' may include a second electrode E21 on the phase change layer P11. The phase change layer P11 may include a 2D material having a layered structure as described with reference to FIGS. 1 to 9. In the phase change layer P11, a partial region R11 contacting the plug-type electrode portion EP2 may be a "phase change region". The phase change region R11 may correspond to the phase change region R10 of FIG. 2.

FIG. 11 is a cross-sectional view illustrating a phase change memory device 100''' according to some example embodiments.

Referring to FIG. 11, the phase change memory device 100''' may include a phase change layer P12 that may include a pad or layer-shaped portion (hereinafter referred to as "pad portion") PP1 and a plug portion PP2 provided under the pad portion PP1. The plug portion PP2 may be provided in an interlayer insulating layer NL12, and the pad portion PP1 may be provided on the interlayer insulating layer NL12. A first electrode E12 contacting the plug portion PP2 may be provided on the bottom surface of the interlayer insulating layer NL12. The plug portion PP2 may contact the first electrode E12 and have a smaller width than the first electrode E12. A second electrode E22 may be provided on the pad portion PP1 of the phase change layer P12. In the phase change layer P12, a partial region R12 contacting the first electrode E12 may be a "phase change region".

The structure of FIG. 10 may be manufactured through an easy process. In terms of the ease of processing, the structure of FIG. 10 may be more advantageous than the structure of FIG. 11. Since the phase change region R12 in the structure of FIG. 11 may be smaller than the phase change region R11 of FIG. 10, the structure of FIG. 11 may be more advantageous than the structure of FIG. 10 in terms of the securement of excellent phase change characteristics. When necessary, the structure of FIG. 10 or the structure of FIG. 11 may be selectively used. In some cases, one phase change memory device may use the structure (unit cell structure) of FIG. 10 and the structure (unit cell structure) of FIG. 11 together.

FIG. 12 is a diagram illustrating a volume change according to a phase change of a 2D material usable in a phase change material according to some example embodiments. In some example embodiments, including the example embodiments shown in FIG. 12, the crystalline structure of $MG_x$ (i.e., the 2D material) may be configured to change between the first crystalline structure (2H phase) and the second crystalline structure (1T' phase).

Referring to FIG. 12, a volume change of about 1.5%, with regard to a volume of the 2D material, may occur based on the crystalline structure of the 2D material ($MG_x$) changing between the first crystalline structure (2H phase) and the second crystalline structure (1T' phase). The volume variation according to the phase change of the 2D material according to some example embodiments may be less than about 3% or less than about 2%.

FIG. 13 is a diagram illustrating a volume change according to a phase change of a phase change material according to some example embodiments. The phase change material in some example embodiments, including the example embodiments shown in FIG. 13, is GST ($Ge_2Sb_2Te_5$).

Referring to FIG. 13, a volume change of about 7% occurs according as the phase of the phase change material "$Ge_2Sb_2Te_5$s" according to the comparative example changes between amorphous and crystalline (i.e., face-centered cubic (FCC)). This is about 4.7 times greater than the volume variation (about 1.5%) according to the phase change of the 2D material according to some example embodiments illustrated in FIG. 12.

As illustrated in FIGS. 12 and 13, the volume variation (about 1.5%) according to the phase change of the 2D material according to some example embodiments may be considerably smaller than the volume variation (about 7%) according to the phase change of the phase change material according to the example embodiments shown in FIG. 13. In particular, since the thickness of the 2D material is small, the size of the effective phase change region may be relatively smaller than the size of the conventional phase change material and the volume change of the effective phase change region may be very small. The device durability and reliability may be improved as the volume variation according to the phase change decreases. Thus, when the 2D material according to some example embodiments is used as the phase change material, the durability and reliability of the phase change memory device may be greatly improved.

The activation energy for (e.g., the activation energy associated with) a reset operation of $MG_x$ (e.g., $MoTe_x$) usable as the phase change material according to some example embodiments may be about 0.89 eV, and the activation energy for a reset operation of GST ($Ge_2Sb_2Te_5$) according to the example embodiments shown in FIG. 13 may be about 2.56 eV to about 2.59 eV. Also, the activation energy for a set operation of GST ($Ge_2Sb_2Te_5$) may be about 2.84 eV to about 3.10 eV. In some example embodiments, the activation energy for a phase change of the 2D material according to some example embodiments may be considerably lower than the activation energy for a phase change of the phase change material (GST) according to the example embodiments shown in FIG. 13. The activation energy for a phase change of the 2D material according to some example embodiments may be smaller than 1 eV, and the activation energy for a phase change of the phase change material (GST) according to the example embodiments shown in FIG. 13 may be greater than 2.5 eV. Thus, when the 2D material according to some example embodiments is used as the phase change material, the phase change speed (i.e., the operation speed) may be greatly improved. In addition, the volume of the formula unit (F.U.) of the 2D material ($MG_x$) according to some example embodiments may be about 150 $Å^3$, and the volume of the formula unit (F.U.) of GST ($Ge_2Sb_2Te_5$) according to the example embodiments shown in FIG. 13 may be about 200 $Å^3$.

FIG. 14 is a graph illustrating the measurement results of a resistance variation according to a phase change of a phase change material according to some example embodiments. The phase change material may include a phase change material included in the phase change layer P10 shown in at least FIG. 1. FIG. 14 illustrates the temperature-dependent resistance of $MG_x$ where the phase of $MG_x$ is 2H and/or 1T'.

Referring to FIG. 14, the resistance variation (ratio) according to the phase change of the phase change material according to some example embodiments may be about $10^4$ to about $10^5$. This is a relatively high value, considering that the resistance variation according to the phase change of the phase change material GST ($Ge_2Sb_2Te_5$) according to the comparative example is about $10^3$ to about $10^4$. Thus, when the phase change material according to some example embodiments is used, a memory device having a wide memory window and excellent operation characteristics may be implemented.

An energy bandgap in the 2H crystalline structure of the phase change material ($MG_x$) according to some example embodiments may be about 1 eV to about 1.1 eV, and an energy bandgap in the 1T' crystalline structure may be about 0.06 eV. The energy bandgap in the amorphous state of the phase change material ($Ge_2Sb_2Te_5$) according to the comparative example may be about 0.5 eV to about 2 eV, and the energy bandgap in the crystalline state (FCC) may be about 0.5 eV to about 1.5 eV. Thus, the variation of the energy bandgap according to the phase change of the phase change material according to some example embodiments may be greater than that of the phase change material according to the comparative example.

According to some example embodiments, the first electrode, the phase change layer, and the second electrode may constitute a unit cell, and a switching device connected electrically to the unit cell may be further provided. The unit cell and the switching device connected thereto may constitute one memory cell. In this case, the switching device may include various devices including a transistor, a diode, a threshold switch, and a varistor. This will be described in more detail with reference to FIGS. 15 to 17.

FIG. 15 is a circuit diagram illustrating a circuit configuration of a phase change memory cell according to some example embodiments.

Referring to FIG. 15, a memory element ME1 according to some example embodiments may be provided, and a switching device SD1 connected electrically to the memory element ME1 may be provided. The memory element ME1 may include the phase change memory device 100, 100', 100'', and/or 100''' described with reference to FIGS. 1 to 11. The memory element ME1 may include the phase change layer described with reference to FIGS. 1 to 11. The memory element ME1 may be a unit cell including the phase change layer and the first and second electrodes connected thereto. In some example embodiments, the switching device SD1 may be a transistor. For example, the switching device SD1 may be a transistor such as a metal-oxide-semiconductor field-effect transistor (MOSFET) or a bipolar junction transistor (BJT). The memory element ME1 may be connected to a bit line BL, and the switching device SD1 may be connected to a word line WL. The bit line BL and the word line WL may extend in the directions intersecting each other.

FIG. 16 is a circuit diagram illustrating a circuit configuration of a phase change memory cell according to some example embodiments.

Referring to FIG. 16, a memory element ME1 may be provided, and a switching device SD2 connected electrically to the memory element ME1 may be provided. The switching device SD2 may be a diode. For example, the switching device SD2 may be a PN diode or a Schottky diode, and may also be a silicon-based diode or an oxide semiconductor-based diode. In addition, the types or materials of the diode may vary according to various embodiments. A word line WL and a bit line BL may be disposed to intersect each other, and the memory element ME1 and the switching device SD2 may be connected to an intersection therebetween.

FIG. 17 is a circuit diagram illustrating a circuit configuration of a phase change memory cell according to some example embodiments.

Referring to FIG. 17, a memory element ME1 may be provided, and a switching device SD3 connected electrically to the memory element ME1 may be provided. The switching device SD3 may be a threshold switch. For example, the switching device SD3 may be an ovonic threshold switch (OTS). The memory element ME1 and the switching device SD3 may be provided at an intersection between a word line WL and a bit line BL. In some cases, a varistor may be used as the switching device SD3.

FIG. 18 is a circuit diagram illustrating an array structure of a phase change memory device according to some example embodiments. The phase change memory device may include the phase change memory device 100, 100', 100'', and/or 100''' described with reference to FIGS. 1 to 11.

Referring to FIG. 18, a plurality of word lines $WL_1$ to $WL_n$ may be arranged to be parallel to each other, and a plurality of bit lines $BL_1$ to $BL_n$ may be arranged to be perpendicular to the word lines $WL_1$ to $WL_n$. The bit lines $BL_1$ to $BL_n$ may be disposed to intersect the word lines $WL_1$ to $WL_n$. A memory cell MC1 may be provided at each of the intersections between the word lines $WL_1$ to $WL_n$ and the bit lines $BL_1$ to $BL_n$. The memory cell MC1 may include a memory element ME10 and a switching device SD10 connected thereto. The configuration of the memory cell MC1 may be identical or similar to that described with reference to FIGS. 15 to 17. Like this, the phase change memory device of FIG. 18 may have a 2D array structure. However, the structure of the phase change memory device according to some example embodiments is not limited to that illustrated in FIG. 18 and may vary according to various embodiments.

A method of operating a phase change memory device according to some example embodiments will be described below with reference to FIGS. 19, 21, and 22.

FIG. 19 is a graph illustrating an operation of a phase change memory device using a phase change layer according to some example embodiments. A phase change layer and a phase change memory device using the same according to the present inventive concepts may be identical or similar to those described with reference to FIGS. 1 to 11 and FIGS. 15 to 18. Thus, the phase change layer may include a 2D material having a layered structure, and the 2D material may include, for example, a chalcogenide-based material or phosphorene. The chalcogenide-based material may include, for example, at least one of $MoTe_x$, $CoTe_x$, $NbS_x$, $SnS_x$, $In_xSe_y$, In—S, Tl—Se, Ge—Te, Ge—S, and Ge—Se. For example, when the chalcogenide-based material is represented by MG$_x$ (where "M" denotes a metal element and "G" denotes a chalcogen element), "x" may satisfy about 1.5≤x<2 (e.g., "x" may be about 1.5≤x<2). In some example embodiments, the 2D material may further include an intercalation material and/or a dopant.

Referring to FIG. 19, the left Y axis represents the intensity of an electrical input signal applied to the phase change layer, and the right Y axis represents the temperature related to the phase change layer. Tc1 and Tc2 represented in the right Y axis respectively represent the first phase change temperature and the second phase change temperature of the 2D material constituting (e.g., at least partially comprising) the phase change layer, and Tm represents the melting temperature of the 2D material. The first phase change temperature Tc1 may be a critical temperature for changing the first crystalline phase of the 2D material into the second crystalline phase, and the second phase change temperature Tc2 may be a critical temperature for changing the second crystalline phase of the 2D material into the first crystalline phase. The first phase change temperature Tc1 may be higher than the second phase change temperature Tc2. The melting temperature Tm may be higher than the first phase change temperature Tc1. The X axis represents time.

A set operation may be performed on the phase change layer. The set operation may be an operation of changing the phase of at least a portion of the 2D material of the phase change layer from the first crystalline phase to the second crystalline phase. The first crystalline phase may be, for example, the 2H crystalline phase (see FIG. 4A), and the second crystalline phase may be, for example, the 1T' crystalline phase (see FIG. 4B). The set operation may include an operation of applying a first electrical signal to the phase change layer for a first time. The operation of applying the first electrical signal may be configured to cool the 2D material after heating the 2D material to a first temperature that is higher than the first phase change temperature Tc1. The resistance (electric resistance) R of the phase change layer may be reduced by the set operation, and the phase change layer may be said to become a set state.

A reset operation may be performed on the phase change layer. The reset operation may be an operation of changing the phase of at least a portion of the 2D material of the phase change layer from the second crystalline phase (e.g., 1T' crystalline phase) to the first crystalline phase (e.g., 2H crystalline phase). The reset operation may include an operation of applying a second electrical signal to the phase change layer for a second time longer than the first time. The intensity (level) of the second electrical signal may be lower than the intensity (level) of the first electrical signal. The operation of applying the second electrical signal may be configured to anneal the 2D material at a second temperature that is lower than the first phase change temperature Tc1 and higher than the second phase change temperature Tc2. The resistance (electric resistance) R of the phase change layer may be increased by the reset operation, and the phase change layer may be said to become a reset state.

The first phase change temperature Tc1 may, for example, be higher than (e.g., greater than) or equal to about 200° C. and lower than or equal to about 500° C. Alternatively, the first phase change temperature Tc1 may be higher than or equal to about 300° C. and lower than or equal to about 500° C. The second phase change temperature Tc2 may, for example, be higher than or equal to about 100° C. and lower than or equal to about 300° C. The melting temperature Tm may be higher than the first phase change temperature Tc1. For example, the melting temperature Tm may be about two times to about three times higher than the first phase change temperature Tc1. As an example, the melting temperature Tm may be about 600° C. to about 1000° C. However, the first phase change temperature Tc1, the second phase change temperature Tc2, and the melting temperature Tm may vary according to the types of the 2D materials constituting the phase change layer.

In some example embodiments, the temperature for the set operation (i.e., the first temperature) may be lower than the melting temperature Tm of the 2D material. Also, the temperature for the reset operation (i.e., the second temperature) may be lower than the melting temperature Tm of the 2D material. Thus, in the set operation, the first crystalline phase may change into the second crystalline phase without passing through the melting state (i.e., liquid state). Also, in the reset operation, the second crystalline phase may change into the first crystalline phase without passing through the melting state (i.e., liquid state). In FIG. 19, the first electrical signal for the set operation and the second electrical signal for the reset operation may be, for example, voltage signals. By applying a voltage between the first and second electrodes, a current may flow through the phase change layer and a phase change may occur due to the Joule heating by the current. However, in some conditions, the first and second electrical signals may be considered as current signals.

FIG. 20 is a graph illustrating an operation of a phase change memory device according to some example embodiments. The operating method of FIG. 20 relates to a phase change memory device using a conventional phase change material (e.g., Ge—Sb—Te).

Referring to FIG. 20, in some example embodiments, the phase change memory device may include a conventional phase change material (e.g., Ge—Sb—Te), and a reset operation may be performed to change the crystalline phase of the phase change material into the amorphous phase (a resistance increase), and a set operation is performed to change the amorphous phase of the phase change material into the crystalline phase (a resistance decrease). The reset operation is performed for a short time by using a high voltage, and the set operation is performed for a long time by using a low voltage. The temperature of the phase change layer is increased by the reset operation to the melting temperature Tm or more, and the temperature of the phase change layer is increased by the set operation to the crystallization temperature Tcryst or more.

In some example embodiments, including the example embodiments shown in FIG. 19, a high-power electrical signal associated with the set operation may be applied for a short time and a low-power electrical signal associated with the reset operation may be applied for a long time. In the example embodiments shown in FIG. 20, application of a high voltage may be associated with the reset operation and an application of a low voltage may be associated with the set operation. In this respect, the method of operating the phase change memory device according to some example embodiments may be different from the method of operating the phase change memory device according to the example embodiments shown in FIG. 20. In some example embodiments, the phase of the 2D material of the phase change material may be reversibly changed between the first crystalline phase and the second crystalline phase, whereas the phase change memory device according to the example embodiments shown in FIG. 20 may be configured to change the phase of the phase change material between the crystalline phase and the amorphous phase. The method of operating the phase change memory device according to some example embodiments is different from the method of operating the phase change memory device according to the example embodiment shown in FIG. 20. Also, the method of operating the phase change memory device according to some example embodiments in which the set and reset operations may be performed at the temperatures lower than the melting temperature Tm, is different from the method of operating the phase change memory device according to the example embodiment shown in FIG. 20 in which the reset operation is performed at the temperatures higher than or equal to the melting temperature Tm.

FIG. 21 is a graph illustrating an operation of a phase change memory device according to some example embodiments. FIG. 21 is a modification of FIG. 19, and those represented by the X axis, the left Y axis, and the right Y axis in FIG. 21 are the same as those in FIG. 19. This is also applied to FIG. 22.

Referring to FIG. 21, a set operation on the phase change layer may be performed to heat the phase change layer to a temperature that is greater than the melting temperature Tm. In other words, the operation of applying the first electrical signal for the set operation may be configured to cool the 2D material after heating the 2D material to the temperature (the first temperature) that is higher than the melting temperature Tm. In some example embodiments, the phase of the 2D material at least partially comprising the phase change layer may be configured to change phase from the first crystalline phase (e.g., 2H crystalline phase) through the melting state (i.e., liquid state) to the second crystalline phase (e.g., 1T' crystalline phase). In this manner, when the phase change is performed through the melting state (liquid state), the phase change speed may increase. A reset operation on the phase change layer may be substantially identical or similar to that described with reference to FIG. 19. Thus, in the reset operation, the 2D material may be annealed at the temperature (the second temperature) that is lower than the first phase change temperature Tc1 and higher than the second phase change temperature Tc2.

FIG. 22 is a graph illustrating an operation of a phase change memory device according to some example embodiments.

Referring to FIG. 22, a set operation on the phase change layer may be substantially identical or similar to that described with reference to FIG. 21. That is, the set operation may be performed to heat the phase change layer to the temperature higher than the melting temperature Tm. In other words, the set operation may include an operation of applying the first electrical signal to the phase change layer, and the operation of applying the first electrical signal may be performed to heat the phase change layer to the melting temperature Tm or more. A reset operation on the phase change layer may include an operation of applying the second electrical signal to the phase change layer, and the operation of applying the second electrical signal may include an initial heating operation and a subsequent annealing operation. In the initial heating operation, the 2D material may be heated to the melting temperature Tm or more. In the subsequent annealing operation, the 2D material may be annealed at the temperature that is lower than the first phase change temperature Tc1 and higher than the second phase change temperature Tc2. Thus, by the reset operation, at least a portion of the phase change layer may change from the second crystalline phase (e.g., 1T' crystalline phase) through the melting state (i.e., liquid state) to the first crystalline phase (e.g., 2H crystalline phase). Thus, according to the present embodiment, the phase of the phase change layer may change through the melting state (liquid state) in both the set operation and the reset operation. In this case, the speed of the set operation and the reset operation may increase. The "melting state" illustrated in FIGS. 21 and 22 may be a complete melting state or a partial melting state. Also, according to some example embodiments, since the melting temperature Tm of the phase change layer may be reduced to a suitable level in various ways, even when the temperatures higher than or equal to the melting temperature Tm are used as illustrated in FIGS. 21 and 22, the heating operation may be performed relatively easily.

Although the methods of operating the phase change memory devices according to various embodiments have been described above with reference to FIGS. 19, 21, and 22, these are merely examples and may vary according to various other embodiments. Also, although these methods mainly illustrate the 2H crystalline phase and the 1T' crystalline phase, they may also be similarly applied to the 2D material having different crystalline phases (first and second crystalline phases).

A phase change memory device according to some example embodiments may be a single-bit memory device having two states of ON and OFF. The ON state may correspond to the set state illustrated in FIG. 19, and may correspond to the case where a portion of the phase change layer having the first crystalline phase changes into the second crystalline phase. The OFF state may correspond to the reset state illustrated in FIG. 19, and may correspond to the case where the entire phase change layer has the first crystalline phase. When the phase change memory device performs a single-bit operation, it may exhibit characteristics illustrated in FIG. 23.

FIG. 23 is a graph illustrating a change in ON and OFF currents according to a switching count number of a phase change memory device according to some example embodiments.

Referring to FIG. 23, since the resistance of the phase change layer is low in the ON state, it may represent a high current level. Since the resistance of the phase change layer is high in the OFF state, it may represent a low current level. The ON state may correspond to data '1' and the OFF state may correspond to data '0', or vice versa. Thus, the phase change memory device may perform a single-bit memory operation of storing data '0' or '1' in one memory cell.

According to some example embodiments, a phase change memory device may be configured to exhibit multi-bit memory characteristics. For example, the phase change memory device may be configured to exhibit characteristics illustrated in FIG. 24.

FIG. 24 is a graph illustrating a resistance change of a phase change layer according to a programming voltage of a phase change memory device according to some example embodiments.

Referring to FIG. 24, the resistance (electric resistance) of the phase change layer may change in several levels (steps) according to changes in the programming voltage. In other words, according to the programming voltages, the phase change layer may have three or more resistance levels that are clearly distinguished from each other. As an example, the phase change layer may have a first resistance level R1, a second resistance level R2, a third resistance level R3, and a fourth resistance level R4. The first resistance level R1 may correspond to data '00', the second resistance level R2 may correspond to data '01', the third resistance level R3 may correspond to data '10', and the fourth resistance level R4 may correspond to data '11'. Thus, the phase change memory device may exhibit one or more multi-bit memory characteristics. Herein, although the case where the phase change layer has four resistance levels has been described, this is merely an example and the phase change layer may have three resistance levels or five or more resistance levels.

The phase change memory device exhibiting multi-bit memory characteristics may be implemented in various ways. As an example, the multi-bit memory characteristics may be implemented ("exhibited") by stepwise-increasing the size (thickness) of the phase change region in the phase change layer P10 of the phase change memory device illustrated in FIG. 1. For example, when the phase change layer P10 includes a plurality of 2D single layers (2D layers), the phase of n single-layer regions may be changed in a first operation, the phase of 2n single-layer regions may be changed in a second operation, the phase of 3n single-layer regions may be changed in a third operation, and the phase of 4n single-layer regions may be changed in a fourth operation. The stepwise phase change may be implemented by adjusting the application time (e.g., a period of elapsed time during which application occurs) or the intensity of an electrical signal applied to the phase change layer P10. Thus, the multi-bit memory characteristics may be implemented (exhibited) based on the phase change memory device including a phase change layer P10 having a layered structure.

According to some example embodiments, the multi-bit memory characteristics may be implemented by using the phase change layer of a multi-layer structure in which a first material layer having a 2D material and a second material layer having a different material are alternately stacked (e.g., the layered structure of at least one layer of two-dimensional (2D) material includes a multi-layer structure, the multi-layer structure including an alternating stack of a first material layer including the 2D material and a second material layer including a different material). This will be described in more detail with reference to FIG. 25.

FIG. 25 is a cross-sectional view illustrating a phase change layer P50 usable in a phase change memory device according to some example embodiments.

Referring to FIG. 25, the phase change layer P50 may have a structure in which a first material layer L10 and a second material layer L20 are alternately stacked. The first material layer L10 may include a 2D material, and the second material layer L20 may include a different material from the first material layer L10. For example, the material of the first material layer L10 may be identical or similar to the material of the phase change layer P10 illustrated in FIG. 1. Thus, the first material layer L10 may include a 2D material having a layered structure, and the 2D material may include a chalcogenide-based material or phosphorene. The second material layer L20 may include a conductive material or a semiconductor material. Also, the material of the second material layer L20 may be a material that does not react with the first material layer L10 or has a low reactivity. As an example, the second material layer L20 may include a metal such as TiN, TaN, WN, Ti, W, Ta, Al, Cu, or Pt, or may include an oxide such as $TiO_2$ or $ZnO_x$.

A process of operating the phase change memory device including the phase change layer P50 illustrated in FIG. 25 may include: changing the phase of the first (lowermost) first material layer L10 in the first operation; changing the phase of the second first material layer L10 in the second operation; and changing the phase of the third first material layer L10 in the third operation. Data may vary according to the number of first material layers L10 in which a phase change occurs. In this manner, when the phase change layer P50 of a multilayer structure is formed and a stepwise phase change operation is performed on the first material layer L10, the multi-level and multi-bit memory characteristics may be easily implemented ("exhibited"). Although FIG. 25 illustrates the case of using three first material layers L10, two first material layers L10 or four or more first material layers L10 may be used. Also, although FIG. 25 illustrates the case where the second material layer L20 includes a conductor or a semiconductor, a thin tunnel insulating layer may be used as the second material layer L20.

FIG. 26 is a cross-sectional view illustrating a phase change memory device according to some example embodiments. The present embodiment relates to a stacked phase change memory device.

Referring to FIG. 26, a plurality of memory devices ML100, ML200, and ML300 may be stacked on a substrate SUB100. Herein, it is illustrated that the memory devices ML100, ML200, and ML300 include a first memory device ML100, a second memory device ML200, and a third memory device ML300. Each of the memory devices ML100, ML200, and ML300 may include, for example, an array structure (circuit structure) described with reference to FIG. 18. The memory devices ML100, ML200, and ML300 may be stacked with interlayer insulating layers NL100 and NL200 therebetween. The first interlayer insulating layer NL100 may be provided between the first memory device ML100 and the second memory device ML200, and the second interlayer insulating layer NL200 may be provided between the second memory device ML200 and the third memory device ML300. Although not illustrated, an additional interlayer insulating layer and an additional memory device may be alternately stacked one or more times over the third memory device ML300.

According to some example embodiments, a phase change layer (memory layer) may be easily formed by a relatively low-temperature process (e.g., a process of about 600° C. or less or about 500° C. or less). Thus, the stacked phase change memory device illustrated in FIG. 26 may be easily manufactured. When a high-temperature process (e.g., a high-temperature deposition process or a high-temperature annealing process) or an epitaxial growth process is required to form the phase change layer, it may be difficult to implement the stacked phase change memory device illustrated in FIG. 26. This is because other portions of the device may be damaged by the high-temperature process and it is not easy to provide a seed layer for epitaxial growth. However, according to the present embodiments, since the 2D material of the phase change layer may be easily formed at relatively-low temperatures (e.g., about 600° C. or less or about 500° C. or less), the stacked phase change memory device may be easily manufactured without restriction by the high-temperature process. In this case, since the number of memory cells per unit area may be greatly increased by stacking the memory devices ML100, ML200, and ML300 in the vertical direction, the storage density and capacity of the memory device may be greatly increased. Also, when the high-temperature process is used, the material usable as the substrate SUB100 may be restricted. However, in some example embodiments, since a relatively low-temperature process may be used, the type of the material usable in the substrate SUB100 may be diversified.

According to some example embodiments, a first electrode and a second electrode may be disposed to be spaced apart from each other in the horizontal direction, and a phase change layer may be provided between the first electrode and the second electrode. Thus, a unit cell having a lateral structure and a memory device including the same may be manufactured. This will be described with reference to FIGS. 27 and 28.

FIG. 27 is a cross-sectional view illustrating a phase change memory device according to some example embodiments.

Referring to FIG. 27, a phase change layer P17 may be provided on/over a substrate SUB17, and a first electrode E17 and a second electrode E27 may be provided to respectively contact (or be connected to) both ends of the phase change layer P17. The phase change layer P17 may correspond to or may be similar to the phase change layers P10, P10', and P15 described with reference to FIGS. 1 to 9. The phase change layer P17 may be disposed between two insulating layers N17 and N27. That is, the first insulating layer N17 may be provided between the substrate SUB17 and the phase change layer P17, and the second insulating layer N27 may be provided on the phase change layer P17. The first insulating layer N17, the phase change layer P17, and the second insulating layer N27 may be said to constitute a stack structure, and the first electrode E17 and the second electrode E27 may be provided to cover both ends of the stack structure.

FIG. 28 is a plan view illustrating an example of a plan structure of the phase change memory device of FIG. 27. FIG. 28 illustrates a top-view structure (i.e., top view) of the first electrode E17, the second electrode E17, and the phase change layer P17 of FIG. 27.

Referring to FIG. 28, the first electrode E17 and the second electrode E27 may be spaced apart from each other in the horizontal direction, and the phase change layer P17 may be disposed therebetween. The first electrode E17 and the second electrode E27 may respectively contact (or be connected to) both ends of the phase change layer P17. The first electrode E17 and the second electrode E27 may have an asymmetrical structure with respect to the phase change layer P17. For example, any one of the first electrode E17 and the second electrode E27 may have a larger size than the other. Herein, it is illustrated that the first electrode E17 is smaller than the second electrode E27. The first electrode E17 and the second electrode E27 may be said to respectively correspond to the first electrode E10 and the second electrode E20 of FIG. 1. A phase change may occur in a partial region of the phase change layer P17 contacting the first electrode E17 having a relatively small size. In this manner, when the phase change memory device having a lateral structure is constructed and the first electrode E17 having a small size is used, the volume of a phase change region in the phase change layer P17 may be greatly reduced. Thus, the operation characteristics may be easily improved.

The structure of a horizontal phase change memory device described with reference to FIGS. 27 and 28 is merely an example and may vary according to various embodiments. For example, at least one of the first insulating layer N17 and the second insulating layer N27 may not be provided, and the phase change layer and the insulating layer may be alternately stacked two or more times in some cases. Also, the shapes and sizes of the first electrode E17 and the second electrode E27 may vary according to various embodiments. Also, the horizontal phase change memory device may be manufactured to have the circuit configuration of FIGS. 15 to 17 and the array structure of FIG. 18. Also, the horizontal phase change memory device may be applied to the stacked memory device of FIG. 26. For example, at least one of the memory devices ML100, ML200, and ML300 of FIG. 26 may have the configuration of the horizontal phase change memory device.

In some example embodiments, a phase change memory device, including one or more of the phase change memory devices illustrated in the drawings herein, may be included in a memory device. The memory device may be a non-volatile memory device, including a flash memory, ferro-electric RAM (FeRAM), and magnetic RAM (MRAM).

The memory device may include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

In some example embodiments, the phase change memory device may be included in a computer system that includes the phase change memory device and a processor. The processor may include a Central Processing Unit (CPU), a controller, an arithmetic logic unit (ALU), a digital signal processor, a microcomputer, a field programmable gate array (FPGA), a System-on-Chip (SoC), an application-specific integrated circuit (ASIC), a programmable logic unit, a microprocessor, or any other device capable of responding to and executing instructions in a defined manner. The phase change memory device may be configured to store a program of instructions, and the processor may be configured to execute the stored program of instructions to perform one or more operations.

FIG. 29 is a diagram illustrating an electronic device 500 according to some example embodiments.

Referring to FIG. 29, the electronic device 2900 includes a memory 2920, a processor 2930, and a communication interface 2950. The memory 2920 may include any of the phase change memory devices illustrated and described herein, including the example embodiments of the phase change memory device 100, 100', 100", and/or 100''' described with reference to FIGS. 1 to 11.

The electronic device 2900 may be included in one or more various electronic devices, including, for example, a mobile phone, a digital camera, a sensor device, a biosensor device, and the like. In some example embodiments, the electronic device 2900 may include one or more of an image providing server, a mobile device, a computing device, an image outputting device, and an image capturing device. A mobile device may include a mobile phone, a smartphone, a personal digital assistant (PDA), some combination thereof, or the like. A computing device may include a personal computer (PC), a tablet computer, a laptop computer, a netbook, some combination thereof, or the like. An image outputting device may include a TV, a smart TV, some combination thereof, or the like. An image capturing device may include a camera, a camcorder, some combination thereof, or the like.

The memory 2920, the processor 2930, and the communication interface 2950 may communicate with one another through a bus 2910.

The communication interface 2950 may communicate data from an external device using various Internet protocols. For example, the communication interface 2950 may communicate sensor data generated by a sensor (not illustrated) of the electronic device 2900 to an external device. The external device may include, for example, an image providing server, a display device, a mobile device such as, a mobile phone, a smartphone, a personal digital assistant (PDA), a tablet computer, and a laptop computer, a computing device such as a personal computer (PC), a tablet PC, and a netbook, an image outputting device such as a TV and a smart TV, and an image capturing device such as a camera and a camcorder.

The processor 2930 may execute a program and control the electronic device 2900. A program code to be executed by the processor 2930 may be stored in the memory 2920. An electronic system may be connected to an external device through an input/output device (not shown) and exchange data with the external device.

The memory 2920 may store information. The memory 2920 may be a volatile or a nonvolatile memory. The memory 2920 may be a non-transitory computer readable storage medium. The memory may store computer-readable instructions that, when executed, cause the execution of one or more methods, functions, processes, etc. as described herein. In some example embodiments, the processor 2930 may execute one or more of the computer-readable instructions stored at the memory 2920.

In some example embodiments, the electronic device may include a display panel (not illustrated).

In some example embodiments, the communication interface 2950 may include a USB and/or HDMI interface. In some example embodiments, the communication interface 2950 may include a wireless communication interface.

According to various embodiments described above, a phase change layer having excellent properties and a high-performance memory device including the same may be implemented by using the 2D material having a layered structure. In particular, a phase change layer capable of satisfying various requirements such as high operation speed, high data endurance, low thermal conductivity, and lower power consumption and a memory device including the same may be implemented. Also, if necessary, a phase change memory device exhibiting multi-bit memory characteristics and/or a stacked phase change memory device may be easily implemented, and various effects may be obtained accordingly.

Although many details have been described above, they are not intended to limit the scope of the inventive concepts, but should be interpreted as examples of the embodiments. For example, those of ordinary skill in the art will understand that the configurations of the phase change memory devices described with reference to FIGS. 1 to 11, 15 to 18, and 25 to 28 may be variously modified. Also, those of ordinary skill in the art will understand that the phase change memory device operating methods described with reference to FIGS. 19, 21, and 22 may vary according to various embodiments. Therefore, the scope of the inventive concept should be defined not by the described embodiments but by the technical spirit and scope described in the following claims.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A phase change memory device, comprising:
   a first electrode;
   a second electrode; and
   a phase change layer between the first electrode and the second electrode, the phase change layer including a layered structure of at least one layer of two-dimensional (2D) material, the at least one layer of 2D material configured to at least partially change phase between a first crystalline phase and a second crystalline phase based on an electrical signal applied to the phase change layer through the first electrode and the second electrode, the second crystalline phase having a crystalline structure different from the first crystalline phase, none of the first and second crystalline phases being an amorphous phase.

2. The phase change memory device of claim 1, wherein the 2D material includes a chalcogenide-based material.

3. The phase change memory device of claim 2, wherein the chalcogenide-based material includes at least one of $MoTe_x$, $CoTe_x$, $NbS_x$, $SnS_x$, $In_xSe_y$, In—S, Tl—Se, Ge—Te, Ge—S, and Ge—Se.

4. The phase change memory device of claim 2, wherein, the chalcogenide-based material has a chemical formula unit of $MG_x$, "M" is a metal element, "G" is a chalcogen element, and "x" satisfies about $1.5 \leq x < 2$.

5. The phase change memory device of claim 2, wherein the 2D material includes a mixture of a first chalcogenide-based material and a second chalcogenide-based material.

6. The phase change memory device of claim 5, wherein, the first chalcogenide-based material is $MoTe_x$; and the second chalcogenide-based material is $WTe_x$.

7. The phase change memory device of claim 1, wherein the 2D material includes phosphorene.

8. The phase change memory device of claim 1, wherein, the phase change layer further includes an intercalation material in the layered structure of the 2D material; and the intercalation material includes Li.

9. The phase change memory device of claim 1, wherein, the phase change layer further includes a dopant, the dopant included in the 2D material; and the dopant includes at least one of N, O, Si, and W.

10. The phase change memory device of claim 1, wherein the 2D material is associated with a phase change temperature that is greater than or equal to about 200° C. and lower than or equal to about 500° C.

11. The phase change memory device of claim 1, wherein the phase change layer has a thickness that is equal to or less than about 50 nm.

12. The phase change memory device of claim 1, wherein the at least one layer of 2D material includes a layer that extends substantially in parallel to a surface of a substrate.

13. The phase change memory device of claim 1, wherein the at least one layer of 2D material includes a layer that extends substantially in perpendicular to a surface of a substrate.

14. The phase change memory device of claim 1, wherein, the first electrode includes a plug-type electrode portion; the plug-type electrode portion has a width that is smaller than a width of the phase change layer; and the plug-type electrode portion is in contact with the phase change layer.

15. The phase change memory device of claim 1, wherein, the phase change layer includes a plug portion; the plug portion has a width that is smaller than a width of the first electrode; and the plug portion is in contact with the first electrode.

16. The phase change memory device of claim 1, further comprising:
a unit cell, the unit cell including the first electrode, the phase change layer, and the second electrode; and
a switching device electrically connected to the unit cell, the switching device including at least one of
a transistor,
a diode,
a threshold switch, and
a varistor.

17. The phase change memory device of claim 1, wherein the phase change layer is configured to exhibit one or more multi-bit memory characteristics.

18. The phase change memory device of claim 17, wherein
the phase change layer includes a multi-layer structure, the multi-layer structure including an alternating stack of a first material layer including the 2D material and a second material layer including a different material; and
the multi-layer structure is configured to exhibit the one or more multi-bit memory characteristics of the phase change layer.

19. The phase change memory device of claim 1, wherein the phase change memory device is a stacked memory device, the stacked memory device including a plurality of memory devices stacked on a substrate.

20. A method of operating a phase change memory device, the method comprising:
applying a first electrical signal to a phase change layer for a first period of elapsed time, the phase change layer including a layered structure of at least one layer of two-dimensional (2D) material, to change a phase of at least a portion of the at least one layer of 2D material from a first crystalline phase to a second crystalline phase and to reduce a resistance of the phase change layer to cause the phase change layer to become a set state; and
applying a second electrical signal to the phase change layer for a second period of elapsed time to change the phase of at least the portion of the at least one layer of 2D material from the second crystalline phase to the first crystalline phase and to increase the resistance of the phase change layer to cause the phase change layer to become a reset state, the second period of elapsed time being longer than the first period of elapsed time.

21. The method of claim 20, wherein,
the phase change layer is associated with a first phase change temperature and a second phase change temperature,
the first phase change temperature is a particular critical temperature associated with a phase change from the first crystalline phase into the second crystalline phase, such that the phase change layer is configured to change phase from the first crystalline phase to the second crystalline phase based on being at the first phase change temperature,
the second phase change temperature is a separate critical temperature associated with a phase change from the second crystalline phase into the first crystalline phase, such that the phase change layer is configured to change phase from the second crystalline phase to the first crystalline phase based on being at the second phase change temperature,
the first phase change temperature is greater than the second phase change temperature;
the applying of the first electrical signal includes cooling the 2D material after heating the 2D material to a first temperature that is greater than the first phase change temperature; and
the applying of the second electrical signal includes annealing the 2D material at a second temperature that is lower than the first phase change temperature and greater than the second phase change temperature.

22. The method of claim 21, wherein the first temperature is lower than a melting temperature of the 2D material.

23. The method of claim 21, wherein,
the first temperature is greater than a melting temperature of the 2D material; and
the second temperature is lower than the melting temperature of the 2D material.

24. The method of claim 21, wherein,
the applying of the second electrical signal includes performing an initial heating operation and subsequently performing an annealing operation;
performing the initial heating operation includes heating the 2D material to at least a melting temperature of the 2D material; and
performing the annealing operation includes annealing the 2D material at the second temperature.

25. The method of claim 21, wherein the first phase change temperature is greater than or equal to about 200° C. and lower than or equal to about 500° C.

26. The method of claim 21, wherein the second phase change temperature is greater than or equal to about 100° C. and lower than or equal to about 300° C.

27. The method of claim 20, wherein the 2D material includes a chalcogenide-based material.

28. The method of claim 20, wherein the 2D material includes phosphorene.

29. A phase change layer, comprising:
a layered structure of a two-dimensional (2D) material, the layered structure including at least one layer of the 2D material, the at least one layer of the 2D material configured to at least partially change phase between a first crystalline phase and a second crystalline phase based on an electrical signal applied to the phase change layer, the second crystalline phase having a crystalline structure different from the first crystalline phase, none of the first and second crystalline phases being an amorphous phase.

30. The phase change layer of claim 29, wherein,
the layered structure is configured to be included in a phase change memory device, such that the layered structure is between a first electrode and a second electrode, and the at least one layer of the 2D material is configured to at least partially change phase based on an electrical signal applied to the at least one layer of the 2D material through the first electrode and the second electrode.

31. The phase change layer of claim 29, wherein the 2D material includes a chalcogenide-based material.

32. The phase change layer of claim 31, wherein the chalcogenide-based material includes at least one of $MoTe_x$, $CoTe_x$, $NbS_x$, $SnS_x$, $In_xSe_y$, In—S, Tl—Se, Ge—Te, Ge—S, and Ge—Se.

33. The phase change layer of claim 31, wherein,
the chalcogenide-based material has a chemical formula unit of $MG_x$, "M" is a metal element, "G" is a chalcogen element, and "x" satisfies about $1.5 \leq x < 2$.

34. The phase change layer of claim 31, wherein the 2D material includes a mixture of a first chalcogenide-based material and a second chalcogenide-based material.

35. The phase change layer of claim 34, wherein,
the first chalcogenide-based material is $MoTe_x$; and
the second chalcogenide-based material is $WTe_x$.

36. The phase change layer of claim 29, wherein the 2D material includes phosphorene.

37. The phase change layer of claim 29, wherein,
the phase change layer further includes an intercalation material in the layered structure of the 2D material; and
the intercalation material includes Li.

38. The phase change layer of claim 29, wherein,
the phase change layer further includes a dopant, the dopant included in the 2D material; and
the dopant includes at least one of N, O, Si, and W.

39. The phase change layer of claim 29, wherein the 2D material is associated with a phase change temperature that is greater than or equal to about 200° C. and lower than or equal to about 500° C.

40. The phase change layer of claim 29, wherein the at least one layer of the 2D material includes a layer that extends in a curvature.

41. The phase change layer of claim 29, wherein the at least one layer of the 2D material includes a layer that extends in a non-linear pattern.

* * * * *